US012686052B2

(12) United States Patent

Ghoshal et al.

(10) Patent No.: US 12,686,052 B2

(45) Date of Patent: Jul. 21, 2026

(54) SINTERING COMPOSITION

(71) Applicant: Alpha Assembly Solutions Inc., Waterbury, CT (US)

(72) Inventors: Shamik Ghoshal, Waterbury, CT (US); Nirmalya Kumar Chaki, Waterbury, CT (US); Remya Chandran, Waterbury, CT (US); Manoharan Venodh, Waterbury, CT (US); Bawa Singh, Waterbury, CT (US); Barun Das, Waterbury, CT (US); Niveditha Nagarajan, Waterbury, CT (US); Rahul Raut, Waterbury, CT (US); Oscar Khaselev, Waterbury, CT (US); Ranjit Pandher, Waterbury, CT (US); Supriya Devarajan, Waterbury, CT (US); Anubhav Rustogi, Waterbury, CT (US)

(73) Assignee: ALPHA ASSEMBLY SOLUTIONS INC., Waterbury, CT (US)

( * ) Notice: Subject to any disclaimer, the term of this patent is extended or adjusted under 35 U.S.C. 154(b) by 942 days.

(21) Appl. No.: 17/754,125

(22) PCT Filed: Sep. 24, 2020

(86) PCT No.: PCT/EP2020/025434

§ 371 (c)(1),
(2) Date: Mar. 24, 2022

(87) PCT Pub. No.: WO2021/058133

PCT Pub. Date: Apr. 1, 2021

(65) Prior Publication Data

US 2022/0371089 A1 Nov. 24, 2022

Related U.S. Application Data

(60) Provisional application No. 62/904,879, filed on Sep. 24, 2019.

(51) Int. Cl.
$H01B$ $1/20$ (2006.01)
$B05D$ $5/12$ (2006.01)
(Continued)

(52) U.S. Cl.
CPC ................. *B22F 7/04* (2013.01); *B05D 5/12* (2013.01); *B22F 1/107* (2022.01); *B22F 9/30* (2013.01);
(Continued)

(58) Field of Classification Search
CPC .... H01B 1/20; H01B 1/22; B05D 5/12; B22F 7/04
See application file for complete search history.

(56) References Cited

U.S. PATENT DOCUMENTS 5,176,744 A * 1/1993 Muller ................... H05K 3/105
106/1.26
8,088,307 B2 * 1/2012 Heo ....................... H05K 1/095
252/514

(Continued)

FOREIGN PATENT DOCUMENTS

CA 3052751 A1 * 8/2018 .............. B41M 1/12
DE 4425815 C1 * 8/1995
(Continued)

OTHER PUBLICATIONS

Kajita "Formation of silver oxalate film from a supersaturated solution of silver oxalate to a silver electrode", Surface Science, vol. 10 (1989) Issue 9 (English language translation).*
(Continued)

*Primary Examiner* — Mark Kopec

(74) *Attorney, Agent, or Firm* — Stinson LLP

(57) ABSTRACT

A sintering composition, consisting essentially of: a solvent; and a metal complex dissolved in the solvent, wherein: the sintering composition contains at least 60 wt. % of the metal
(Continued)

complex, based on the total weight of the sintering composition; and the sintering composition contains at least 20 wt. % of the metal of the metal complex, based on the total weight of the sintering composition.

21 Claims, 12 Drawing Sheets

(51) Int. Cl.

| | | |
|---|---|---|
| *B22F 1/107* | (2022.01) | |
| *B22F 7/04* | (2006.01) | |
| *B22F 9/30* | (2006.01) | |
| *B23K 35/30* | (2006.01) | |
| *H01B 1/02* | (2006.01) | |
| *H01B 13/012* | (2006.01) | |
| *H05K 1/09* | (2006.01) | |
| *H05K 3/12* | (2006.01) | |
| *H05K 3/3485* | (2026.01) | |
| *H05K 3/3494* | (2026.01) | |
| *B23K 101/38* | (2006.01) | |
| *B23K 101/40* | (2006.01) | |
| *B23K 101/42* | (2006.01) | |
| *H10W 72/00* | (2026.01) | |
| *H10W 72/30* | (2026.01) | |
| *H10W 90/00* | (2026.01) | |

(52) U.S. Cl.

CPC ........... *B23K 35/3006* (2013.01); *H01B 1/02* (2013.01); *H01B 1/20* (2013.01); *H01B 13/01209* (2013.01); *H05K 1/097* (2013.01); *H05K 3/1216* (2013.01); *H05K 3/1283* (2013.01); *H05K 3/3485* (2020.08); *H05K 3/3494* (2013.01); *B22F 2007/047* (2013.01); *B22F 2203/11* (2013.01); *B22F 2302/45* (2013.01); *B22F 2303/40* (2013.01); *B23K 2101/38* (2018.08); *B23K 2101/40* (2018.08); *B23K 2101/42* (2018.08); *H10W 72/01323* (2026.01); *H10W 72/07331* (2026.01); *H10W 72/07336* (2026.01); *H10W 72/07341* (2026.01); *H10W 72/352* (2026.01); *H10W 90/734* (2026.01)

(56) References Cited

U.S. PATENT DOCUMENTS

| | | | | |
|---|---|---|---|---|
| 8,961,835 B2 * | 2/2015 | Seong | .................... | H05K 1/092 |
| | | | | 252/512 |
| 10,144,066 B2 * | 12/2018 | Kumaki | .................. | B22F 1/102 |
| 10,301,497 B2 | 5/2019 | Walker | | |
| 10,301,499 B2 * | 5/2019 | Kim | .................... | C09D 127/18 |
| 11,045,910 B2 | 6/2021 | Schmitt et al. | | |
| 11,472,980 B2 | 10/2022 | Kell et al. | | |
| 2012/0114927 A1 | 5/2012 | Khaselev et al. | | |
| 2012/0153012 A1 | 6/2012 | Schafer et al. | | |
| 2014/0134454 A1 | 5/2014 | Fuchs et al. | | |
| 2014/0234649 A1 | 8/2014 | Kalich et al. | | |
| 2017/0073529 A1 | 3/2017 | Wu et al. | | |
| 2017/0130084 A1 | 5/2017 | Kell et al. | | |

FOREIGN PATENT DOCUMENTS

| | | | | |
|---|---|---|---|---|
| EP | 2420336 | A1 | | 2/2012 |
| EP | 3085811 | A1 | | 10/2016 |
| JP | 2009099518 | A | | 5/2009 |
| JP | 2010177084 | A | | 8/2010 |
| JP | 2015131991 | A | * | 7/2015 |
| JP | 2015199059 | A | * | 11/2015 |
| WO | 2014/068299 | A1 | | 5/2014 |
| WO | 2015/155542 | A1 | | 10/2015 |
| WO | 2018/146618 | A1 | | 8/2018 |

OTHER PUBLICATIONS

Shen Longguang, et al., "Electrically Conductive Silver Paste Obtained by Use of Silver Neodecanoate as Precursor", Journal of Electronic Materials, Warrendale , PA, US, vol. 44, No. 2, Dec. 4, 2014 (Dec. 4, 2014), pp. 720-724; XP035423787, ISSN: 0361-5235, DOI: 10.1007/S11664-014-3533-3; Experimental; p. 721; p. 721, right-hand column, paragraph 2.

Application of Titanium Dioxide Nanomaterials in Tobacco Harm Reduction, Chapter 2. Synthesis Methods for Titanium Dioxide Nanomaterials, Wei Xie, Chief Ed., Huazhong University of Science and Technology Press, Apr. 2016, (China Tobacco Series Books), Wuhan, China. 5 pages.

Information Recording Materials, 2nd Ed., 2. Metal Organic Compound Conductive Ink, Quanxiang Liu, Chief Ed., Printing Industry Press, Nov. 2014, Beijing, China. 4 pages.

Monitoring, Evaluation, and Control Technology for Nanoparticle Exposure in the Workplace, Chapter 1. Nanomaterial Applications and the Health Risks Thereof, M. Zhang and S. Tang, Chief Eds., China Environmental Publishing Group, Feb. 2018, Beijing, China, 3 pages.

Multicomponent Complex Electroplating, II. Pi Complexes, Jingli Fang, Ed., National Defense Industry Press, Jun. 1983, Beijing, China, 3 pages.

* cited by examiner

Die

Silver
layer

DBC

Die

Silver
layer

DBC

Die

Silver
layer

DBC

Die

Silver
layer

Silver
layer

DBC

SINTERING COMPOSITION

The present invention relates to a sintering composition and a method of manufacturing the same, use of the sintering composition, a sintered metal deposit and a method forming the same on a substrate, a method of die attachment, a method of forming an electrical circuit or an interconnect on a substrate, a method of forming a joint, a sintered joint and a method of manufacturing a soldered assembly.

In the electronic industry, semiconductor device interconnection to the substrate is an important part of device packaging. In today's era of printed electronics, there is a huge demand for the interconnect material with low temperature processing and high electrical and thermal conductivity.

Conductive adhesives and solder pastes, which are still widely used as interconnects, have limitations in high temperature operation resulting in solder joint fatigue and reliability problems like intermetallic compound growth. These materials also have relatively low thermal and electrical conductivity.

Sintered joints provide an alternative to soldered joints. The formation of sintered joints using nanoparticles, for example, is beneficial because they can be sintered or fused at lower temperatures compared to the formation of soldered joints. Silver based sintering materials are of great interest in printed electronics due to their higher thermal and electrical conductivity, particularly if joints of pure silver are formed. They also do not have much of a fatigue problem in high temperature applications. Unlike soldering, the sintering phenomena is an atomic diffusion process which eliminates the intermediate liquid phase of soldering and thus resolves the issue of chipping and swimming of dies. Usually, the metal die attach materials are based on technology platforms such as: nanoparticle-based materials, micron sized flakes in a polymer binder or a mixture of metal micron flakes with a metal-organic compound. Nanoparticle-based die attach materials typically have separation issues because of the general tendency of nanoparticles to agglomerate, which, among other things, clogs up nozzles of ink jets and makes them generally harder to handle. Apart from the stability issue, these agglomerated nanoparticles are also the potential cause for print defects. It has been attempted to address the issue of agglomeration by capping the nanoparticles with an organic moiety with a long carbon chain. The interconnect material along with the capped nanoparticle is usually composed of polymers, additives/activators and organic solvents. These organic materials are one of the main concerns in the die attach industry because they aggravate the percentage void and ultimately result in thermal and power cycle failures.

The second approach that is widely being used by the industry for die attach applications is using a mixture of metal-organic compound and metal flakes. The metal-organic compound melts and decomposes to form a metal bridge between the micron metal flakes thereby increasing the contact point and coordination number of the metal, which in turn increases the densification of the metal layer, enhancing the strength of the material and resulting assembly.

Another problem with the metal die attach materials of the prior art is that such materials require many steps in their manufacture, increasing the time and cost of their manufacture. Thus, there is an incentive to provide metal sintering/die attach materials whose manufacture requires fewer steps in order to decrease the time and cost of their manufacture.

For example, WO 2014/068299 and WO 2015/155542 relate to sintering powders which comprise metal particles. The use of a capping agent to prevent agglomeration is also discussed therein.

Literature reports describe the use of silver organic precursors like silver neodecanoate and silver 2-ethylhexanoate, and copper precursors like copper formate and copper acetate for the synthesis of conductive ink for inkjet printing. The main drawback of the metal-organic based conductive inks is their limited solubility in the organic solvents, thereby drastically reducing the possibility of increasing the metal content of the composition. A low metal content limits the thickness of lines that can be produced and also results in a composition that has low viscosity that is not desirable for printing applications. Thus, there is an incentive to increase the metal content in compositions for use in sintering and/or die attach applications.

Many reported metal-organic inks are basically used for flexible electronic applications such as radio frequency identification (RFID) readers, transponder antennas, interconnections for organic light emitting diodes (OLEDs), organic thin film transistors and printed circuits on substrates. These metal-organic based molecular inks are not suitable for screen and stencil printing application because of their extremely low viscosity. Viscosity of the die attach material plays an important role in printing applications. Further, prior art inks have low metal content and the thus the end-result is a thin metallic line or coating.

Accordingly, there is a need to provide a simpler and cheaper sintering composition which is more easily manufactured and which can provide an improved joint strength, superior printed lines & circuits, and with fewer carbon impurities in the joints resulting in higher electrical and thermal conductivities.

The present invention seeks to tackle at least some of the problems associated with the prior art, or at least to provide a commercially acceptable alternative solution thereto. Further, this invention discloses the construction/fabrication of new assemblies, devices and components using the disclosed materials and processes.

In a first aspect, the present invention provides a sintering composition, consisting essentially of: a solvent; and a metal complex dissolved in the solvent, wherein: the sintering composition contains at least 60 wt. % of the metal complex, based on the total weight of the sintering composition; and the sintering composition contains at least 20 wt. % of the metal of the metal complex, based on the total weight of the sintering composition.

Additionally, the present invention provides examples of the uses of this new composition, combined with the processes discussed herein to make new devices, such as sintered die attach methods for power and other electronic devices, printed interconnects and circuits on various metallic substrates and polymeric substrates like PET, PC, PI etc., and coatings on various components, parts and surfaces.

Each aspect or embodiment as defined herein may be combined with any other aspect(s) or embodiment(s) unless clearly indicated to the contrary. In particular, any features indicated as being preferred or advantageous may be combined with any other feature indicated as being preferred or advantageous.

The term "sintering composition" as used herein may encompass a composition capable of forming a sintered metal deposit or a sintered joint. Without being bound by theory, it is considered that such sintering occurs as a result of atomic diffusion.

The term "metal complex" as used herein may encompass a metal cation complexed by ligands, or a metal salt, for example. A metal complex may include one or more different metal atoms of different elements. The metal centre may be neutral or cationic. The ligands may be neutral or anionic.

The sintering composition consists essentially of the solvent and the metal complex dissolved in the solvent. The wording "consisting essentially of" or "consists essentially of" as used herein is to be interpreted as allowing the presence of amounts of other components in addition to the mandatory components, provided that the essential characteristics of the claimed composition are not materially affected by their presence. Thus, the wording "consists essentially of" as used herein also encompasses the occurrence of unavoidable impurities in the sintering composition which do not materially affect the essential characteristics of the sintering composition. Preferably, the sintering composition consists of a solvent and a metal complex dissolved in the solvent.

In an alternative preferred embodiment, the sintering composition comprises a solvent and a metal complex dissolved in the solvent.

By "consisting essentially of" or "consisting of" the recited elements, the sintering composition of the present invention is substantially free of metal particles. The term "substantially" as used herein means that the sintering composition typically comprises less than 1 wt. % metal particles, preferably less than 0.1 wt. % metal particles, based on the total weight of the sintering composition and more preferably the sintering composition is completely free of metal particles, for example.

In addition, by "consisting essentially of" or "consisting of" the recited elements, the sintering composition is substantially free of particles of the metal complex. The term "substantially" as used herein means that the sintering composition typically comprises less than 1 wt. % particles of the metal complex, preferably less than 0.1 wt. % particles of the metal complex, based on the total weight of the sintering composition, and more preferably the sintering composition is completely free of particles of the metal complex. This may be possible due to high solubility of the metal complex in the solvent. The sintering composition may be substantially free of particles of the metal complex because substantially all of the metal complex is dissolved in the solvent. In particular, at least 90 wt. % of the metal complex in the sintering composition may be dissolved in the solvent, preferably at least 95 wt. % of the metal complex in the sintering composition may be dissolved in the solvent, more preferably at least 98 wt. % of the metal complex in the sintering composition may be dissolved in the solvent, based on the total amount of metal complex in the sintering composition, even more preferably at least 99 wt. % of the metal complex in the sintering composition may be dissolved in the solvent, based on the total amount of metal complex in the sintering composition, still even more preferably at least 99.5 wt. % of the metal complex in the sintering composition may be dissolved in the solvent, based on the total amount of metal complex in the sintering composition, still even more preferably at least 99.9 wt. % of the metal complex in the sintering composition may be dissolved in the solvent, based on the total amount of metal complex in the sintering composition, and most preferably the metal complex is completely dissolved in the solvent. Advantageously, because the sintering composition may be substantially free of particles of the metal complex and so may be substantially free of suspended particles, the sintering composition may have favourable long-term physical stability and also have desirable properties for printing.

In addition, by "consisting essentially of" or "consisting of" the recited elements, the sintering composition is substantially free of organic polymers, and preferably substantially free of polymers. The term "substantially" as used herein means that the sintering composition typically comprises less than 1 wt. % organic polymers or polymers, preferably less than 0.1 wt. % organic polymers or polymers, based on the total weight of the sintering composition, and more preferably the sintering composition is completely free of organic polymers or polymers. Since the sintering composition of the present invention is substantially free of metal particles, polymers or other additives or stabilizers are not required to limit the agglomeration of any particles. Accordingly, the sintering composition is much simpler and comprises fewer components resulting in fewer complexities. Advantageously, this also may mean that there are likely to be fewer organic impurities in a sintered joint made using the sintering composition, enabling sintered joints to be made which may be stronger and may exhibit improved thermal and electrical properties.

In addition, by "consisting essentially of" or "consisting of" the recited elements, the sintering composition is substantially free of metal oxide. The term "substantially" as used herein means that the sintering composition typically comprises less than 1 wt. % metal oxide, preferably less than 0.1 wt. % metal oxide, based on the total weight of the sintering composition, and more preferably the sintering composition is completely free of metal oxide.

The sintering composition contains at least 60 wt. % of the metal complex, based on the total weight of the sintering composition. Accordingly, the metal content in the sintering composition may be maximized/optimized. High amounts of complex, i.e. a large complex-to-solvent ratio, in the composition may provide the composition with a sufficient and desirable viscosity for printing applications. In addition, a corresponding lower amount of solvent may enable the solvent to be completely removed as a result of a lower temperature (pre-sintering) drying step and/or a shorter (pre-sintering) drying step. Preferably, the sintering composition contains at least 70 wt. %, more preferably at least 75 wt. %, based on the total weight of the sintering composition. The ability to provide at least 60 wt. % metal complex in solution (as opposed to in suspension) is a result of the unique manufacturing method of the sintering composition described below. The sintering composition may contain up to 95 wt. % metal complex, for example up to 90 wt. % metal complex or up to 85 wt. % metal complex. The sintering composition preferably contains up to 95 wt. % metal complex, more preferably up to 90 wt. % metal complex, even more preferably up to 85 wt. % metal complex.

The sintering composition consists essentially of (or consists of) the solvent and the metal complex dissolved in the solvent. Accordingly, the sintering composition may contain, for example, from 5 to 40 wt. % solvent, or from 10 to 35 wt. % solvent, or from 15 to 30 wt. % solvent, or from 15 to 25 wt. % solvent based on the total weight of the sintering composition.

The sintering composition contains at least 20 wt. % of the metal of the metal complex, based on the total weight of the sintering composition. In other words, the total amount of metal in the sintering composition is at least 20 wt. %, all of which is in the form of metal complex dissolved in the solvent. A higher concentration of metal in the sintering composition means that less solvent must be evaporated during a pre-sintering drying step. Advantageously, this may reduce the time and cost of a sintering process. Moreover, the higher concentration of metal in the sintering composition means that the sintering composition may become more viscous, which is desirable for printing applications. Also, increasing the metal content facilitates the densification of the sintered layer, thereby increasing the bond line thickness of the joint in assembly, which may result in a greater join strength. This may also enable thicker lines to be produced without having to carry out multiple deposit and sintering steps. Preferably, the sintering composition contains at least 25 wt. % metal based on the total weight of the sintering composition, preferably at least 30 wt. % metal based on the total weight of the sintering composition, more preferably at least 35 wt. % metal, even more preferably at least 40 wt. % metal, still, even more preferably at least 50 wt. % metal based on the total weight of the sintering composition. The sintering composition may contain up to 95 wt. % metal, for example up to 90 wt. % metal, or up to 85 wt. % metal. In a preferred embodiment, the sintering composition contains from 60 to 80 wt. % metal based on the total weight of the sintering composition.

The Inventors have surprisingly found that the sintering composition as described herein may be used as an improved alternative to nanoparticle-based materials, micron sized flakes in a polymer binder and/or mixtures of metal micron flakes with metal-organic compounds for die attach applications. It has surprisingly been found that the sintering composition may be sintered at low temperatures and/or low pressures to provide joints which may still exhibit high die shear strength and/or high peel strength compared to those of the prior art, and which may have few organic impurities. This may be due to the absence of other components in the composition, such as rheology modifiers and polymers, which allows the production of a purer sintered metal deposit or sintering joint, for example.

Moreover, the sintering composition as described herein may be more simply manufactured compared to sintering compositions/powders of the prior art, i.e. with fewer steps and using fewer starting materials resulting in fewer complexities, for example. In particular, the manufacture of the sintering composition may be a single step process. Advantageously, the preparation of the sintering composition does not require an intermediate step of making a (metal) powder. This has the advantage that the sintering compositions of the present invention may be manufactured at a lower cost, while achieving comparable, or in fact improved, sintering properties. Sintered joints made using the sintering composition as described herein may advantageously exhibit fewer organic impurities than those made using sintering powders of the prior art, due to the simpler composition consisting essentially of the solvent and the metal complex dissolved in the solvent. The sintering composition of the present invention eliminates the use of any polymers, binders, activators or additives. This, in turn, is thought to contribute to the superior joint strength and reliability that may be exhibited by the sintered metal deposits and/or sintered joints described herein.

Advantageously, the sintering composition as described herein is typically chemically and physically stable at room temperature. Practically, this may enable the sintering composition to be stored for a long time at room temperature before use, and may reduce storage costs. For example, when kept in an amber coloured bottle and in refrigerated conditions, the sintering composition typically exhibits no change in viscosity and its performance does not deteriorate with time.

Sintered metal deposits and/or sintered joints formed using the sintering composition as described herein may also show high thermal and electrical conductivity at much lower processing temperatures and pressures than those of conventional sintering compositions. These advantageous properties may be attributed to the high purity and densified metal deposits and metal joints which may be formed, for example.

The sintering composition as described herein may also be described as a "metallic gel". These terms may be used interchangeably herein.

The formation of the sintering composition is dependent on the solubility of the metal complex in the solvent, which is preferably an organic solvent. Typically, the metal complex has high solubility in the solvent.

Due to the typically high solubility of the metal complex, the sintering composition as described herein does not need any organic polymers or stabilizing agents in the formulation. Without wishing to be bound by theory, it is thought that decomposition of the metal complex on drying and heating leads to the formation of smaller (metal) particles which, under pressure sintering, diffuse to the interface of the substrate and the die resulting in a robust joint strength. Accordingly, low cost, high end performance, long shelf life and high electrical and thermal attributes of the sintering composition may give it a surprising advantage over existing die attach materials.

Unlike conductive inks of the prior art, the sintering composition described herein, because of its typically high metal content and high viscosity, may be used for a variety of die attach applications, which makes it a more versatile material as compared to other sintered materials or conductive inks.

For example, the sintering composition of the present invention may allow for the fabrication of circuits on flexible substrates such as PET and PI. This may therefore enable a futuristic approach for next-generation electronics assembly. Fabricating circuits on the flexible substrates can be easily created using the metallic gels/sintering compositions disclosed herein under appropriate process conditions, which thereby widely opens the scope of attaching solder components, for example, onto the flexible substrates. Also, due to the advantages described herein the current carrying capacity of the interconnect lines and circuit fabricated using the metallic gels is very much superior as compared to any other existing sintering/soldering material which gives the gel/composition an edge over soldering materials.

Without wishing to be bound by theory, it is understood that on heating the metal complex of the sintering composition precipitates out of the solution, melts and decomposes. The organics in the sintering composition, which may include the solvent and/or the ligands of the metal complex, may then evaporate during the drying step prior to sintering, so that substantially no carbon residue exists in the joints after sintering. As the sintering composition is substantially free of metal particles or particles of the metal complex, the presence of rheology modifiers, stabilizing agents or polymers is not needed for the stability of the sintering composition. This means that it is possible to make a carbon-free printable die attach material.

To date, the reported die attach materials contain some amount of organic material for stability. These organic materials are thought to be the prime cause for thermal and electrical fatigue. The joints made with the sintering composition described herein are typically carbon-free. Accordingly, the electrical, thermal and mechanical properties of the joints are typically superior compared to other reported die attach materials.

In addition, the sintering composition/metallic gel as described herein may have a unique soldering feature on its surface. The gels may be easily soldered. The gels may be printed on metallic or polymeric flexible substrates on which the solder components may be attached by soldering. This advantageously allows components to be attached to non-metallic substrates such as polymeric flexible substrates, for example. It is not normally possible to successfully apply solder to deposits made using conventional sintering compositions. This is because such conventional sintering compositions typically contain species such as polymers, which may remain in the sintered joint or cause voids in the sintered joint, and this may hinder soldering.

In addition, the sintering composition/metallic gel as described herein advantageously may be used on flexible substrates. The resulting sintered material is densified in comparison to sintered materials formed using conventional sintering materials. This is due to the higher metal contents of the sintering composition described herein. Such a higher density enables the printing of a feature (circuit line, inter-connect, joint etc.) that is thin enough to ensure flexibility, while also exhibiting sufficient electrical conductivity. Features formed using conventional sintering compositions containing lower metal contents, when made thin enough to provide flexibility, would exhibit inadequate conductivity and vice versa.

Typically, the metal complex substantially decomposes over a temperature range of less than 20° C., preferably less than 15° C., more preferably less than or equal to 10° C. This means that if, for example, on heating the metal complex begins to decompose at a temperature X° C., then the metal complex is preferably substantially decomposed by a temperature of X+20° C., preferably X+15° C., and more preferably X+10° C. The wording "substantially decomposed" as used herein means that typically at least 90 wt. % of the metal complex decomposes, preferably at least 95 wt. %, more preferably at least 99 wt. %, based on the total weight of the metal complex in the sintering composition or most preferably, all of the metal complex decomposes. This is advantageous at least because it may enable the metal complex to decompose to the pure metal without starting to sinter during the drying step described herein. Thus, the subsequent sintering step may be carried out in the presence of only very small amounts, or in the total absence, of any metal complex or ligands. This may therefore result in a purer joint, for example.

Typically, the metal complex is at a high concentration in the solvent. Preferably, the solvent is supersaturated with the metal complex. This supersaturation may be enabled by the high solubility of the metal complex in the solvent. Advantageously, this supersaturation may enable the metal content of the sintering composition to be maximized/optimized. The term "supersaturated" as used herein encompasses the situation where the concentration of the metal complex in the solvent is beyond that of the saturation point, i.e. the solution contains more of the dissolved metal complex than could be dissolved by the solvent under normal circumstances. Moreover, a supersaturated solution is more viscous. A sintering composition with high viscosity is generally preferable for printing applications.

Typically, the metal complex substantially decomposes at a temperature lower than the sintering temperature to be used during application of the sintering composition, for example during the manufacture of a sintered metal deposit or a sintered joint. Preferably, the metal complex substantially decomposes at a temperature that enables substantially all of the metal complex to decompose during the drying step described herein. In particular, the metal complex preferably substantially decomposes at a temperature of less than 200° C. and more preferably less than 190° C. In some embodiments, the metal complex may substantially decompose at a temperature of less than 180° C., or less than 170° C., or less than 160° C. The term "decompose" as used herein encompasses the breakdown of a single entity into two or more fragments/constituent parts. Typically, as used herein, the term "decompose" encompasses the breakdown of the metal complex into the metal, which may be individual atoms or small particles/clusters of the metal, and the ligands and/or organic components of the metal complex. The term "substantially" as used herein means that typically at least 90 wt. % of the metal complex decomposes, preferably at least 95 wt. %, more preferably at least 99 wt. %, based on the total weight of the metal complex or most preferably, all of the metal complex decomposes. Advantageously, the metal complex may substantially decompose at low temperatures. This means that substantially all of the metal complex may decompose at a low temperature and then substantially all of the solvent and substantially all of the ligand of the metal complex may evaporate during the low temperature drying step. Thus, at the low sintering temperatures applied in the methods described herein the likelihood of impurities, organic or otherwise, in the resulting sintered joints may be reduced, and the strength and/or thermal and electrical properties of the sintered joints may therefore be improved. Without wishing to be bound by theory, it is thought that once the metal complex has decomposed, the ligands/constituent parts other than the metal may evaporate leaving the metal to be sintered in a subsequent sintering step to form a sintered joint.

Typically, the solvent and/or the ligand of the metal complex has a boiling point that enables it to evaporate during a pre-sintering drying step, such as the drying step of the methods described herein. Preferably, the solvent and/or the ligand of the metal complex has a boiling point that enables substantially all of solvent and/or the ligand of the metal complex to evaporate during the drying step described herein. In particular, the solvent and/or the ligand of the metal complex typically has a boiling point of less than 300° C., preferably less than 250° C. and more preferably less than 200° C. Advantageously, this means that at the low temperatures applied in the drying step substantially all of the solvent and/or the ligand of the metal complex may evaporate, leaving the metal to be sintered to form the sintered joint. Accordingly, at the low sintering temperatures applied in the methods described herein the likelihood of impurities, organic or otherwise, in the resulting sintered joints may be reduced, and the strength and/or thermal and electrical properties of the sintered joints may therefore be improved. The term "substantially" as used herein means that typically at least 90 wt. % of the solvent and/or the ligand of the metal complex evaporates, preferably at least 95 wt. %, more preferably at least 99 wt. %, based on the total weight of the solvent and/or the ligand of the metal complex or most preferably, all of the solvent and/or the ligand of the metal complex evaporates. The length of the drying step described herein typically enables enough solvent and/or ligand of the metal complex to evaporate, without boiling the solvent, for example. High temperatures during the drying step are undesirable as they may agitate the solution enabling metal nanoparticles to form, come into contact and possibly sinter.

The metal of the metal complex is preferably selected from one or more of silver, gold, platinum, palladium, nickel, copper and molybdenum. Most preferably, the metal of the metal complex is copper and/or silver. Copper and silver are desirable metals from which to form sintered joints because they exhibit favourable characteristics for sintered joints and, in particular, favorable thermal and electrical conductivities.

Typically, the solvent of the sintering composition comprises an organic solvent and preferably, the solvent is an organic solvent. Preferably, the solvent is selected so that the metal complex is highly soluble in the solvent and/or the solvent has a boiling point as described above. The solvent is preferably an alcohol, for example a mono-hydric, di-hydric or tri-hydric alcohol. Preferably, the solvent is selected from one or more of propane-1-2-diol, terpineol, triethylene glycol, glycerol and 2-methyl-1,3-propanediol, more preferably terpineol or glycerol.

The metal complex may comprise a metal-organic complex. For example, preferably, the metal complex is a metal carboxylate, preferably wherein the carboxylate has the structure $RCOO^-$ wherein R is a branched or unbranched hydrocarbon chain having 14 carbon atoms or less, preferably 12 carbon atoms or less and more preferably 10 carbon atoms or less. R may also be a hydrocarbon chain having 2 carbon atoms or less. It may also be preferable that R is a hydrogen atom, preferably a branched or unbranched hydrocarbon chain having 1 carbon atom or more, more preferably 2 carbon atoms or more. For example, R may be a branched or unbranched hydrocarbon chain having from 6 to 14 carbon atoms, preferably from 8 to 12 carbon atoms. This is preferable, for example, when the metal of the metal complex is silver. Alternatively, R may be a hydrogen atom or a branched or unbranched hydrocarbon chain having from 1 to 4 carbon atoms, preferably a hydrogen atom or a hydrocarbon chain having 1 or 2 carbon atoms. This is preferable, for example, when the metal of the metal complex is copper. Preferred ligands include neodecanoate, 2-ethyl hexanoate, formate and acetate.

For example, preferably, the metal complex is selected from one or more of silver neodecanoate, silver 2-ethyl hexanoate, silver oxalate, silver lactate, silver hexafluoro-acetylacetonate cyclooctadiene, copper formate tetrahydrate and copper acetate, preferably silver neodecanoate or copper formate tetrahydrate. Silver neodecanoate, for example, contains about 38 wt. % silver. Accordingly, since the metal complex may be saturated or supersaturated in the sintering composition, by dissolving silver neodecanoate or another metal complex disclosed herein at elevated temperatures, it may be possible to provide a sintering composition wherein the metal/silver content is about 28 wt. % or more.

Typically, if the metal of the metal complex is copper, the copper content of the sintering composition may be about 22.5 wt. % or more.

The viscosity of the sintering composition may be from 60,000 to 120,000 cP, preferably from 70,000 to 80,000 cP. Such a viscosity may result from the large amount of metal complex contained in the sintering composition. The viscosity of the sintering composition may make it suitable for screen and stencil printing and, thereby, desirable for use in die attach industries. The viscosity may be measured with a Brookfield viscometer (HB DV-III) Spindle CP51. The viscosity is measured at a temperature of 25° C., a shear rate of 3.84/s and 1 RPM, for example.

Preferably, the sintering composition is in the form of a gel and more preferably in the form of a metallic gel. The term "gel" as used herein means a sol in which the particles are meshed such that a rigid or semi-rigid mixture results. The sintering composition is typically for die attach applications.

Preferably, the sintering composition of the present invention is in the form of: a gel, preferably a metallic gel; or a free-standing film or foil; or applied, deposited, printed or laminated on a wafer; or applied, deposited, printed or laminated on a substrate fabricated from glass and/or ceramic and/or a metal and/or a polymeric film and/or a composite material used as a printed circuit board. Such forms of the sintering composition may make the sintering composition more useful in different die attach applications.

In a further aspect, the present invention provides a method of manufacturing the sintering composition described herein, the method comprising: providing a solvent; providing a metal complex; and dissolving the metal complex in the solvent at a temperature of from 100° C. to 180° C. to form a solution.

The advantages and preferable features of the first aspect apply equally to this aspect.

Dissolving the metal complex at such an elevated temperature enables more metal complex to be dissolved in the sintering compositions, for example at least 60 wt. %, or at least 65 wt. %, or at least 70 wt. %, or at least 75 wt. %. As discussed above, such high of metal complex may provide the sintering composition with a favourably higher viscosity in comparison to conventional sintering compositions. Typically, the mixture of metal complex and solvent is stirred to promote dissolution.

Preferably, the solution is supersaturated. Preferably, the method further comprises cooling the solution to a temperature of from 30 to 60° C., preferably to a temperature of from 40 to 50° C. Without wishing to be bound by theory, it is thought that this process of heating and cooling may enable the formation of a supersaturated solution, preferably a stable supersaturated solution.

Preferably, the method further comprises milling the solution, typically once cooled in the manner described above. Typically, the milling results in a homogeneous metallic gel. Without wishing to be bound by theory, it is thought that the milling step may reduce the likelihood of precipitation of the metal complex out of solution, particularly once cooled. Preferably, the milling is carried out in a three roll mill, although other milling methods may be employed. The solution may also be homogenized in an orbital mixer at, for example, from 500 to 1500 RPM, such as at 1000 RPM, for, for example, from 1 to 20 minutes, such as for 10 minutes.

Preferably, dissolving the metal complex in the solvent is carried out at a temperature of from 110° C. to 150° C., more preferably from 120° C. to 140° C., even more preferably about 130° C.

Preferably, the sintering composition is free of any metal particles and/or free of any particles of the metal complex. This may enable the sintering composition to have high chemical and physical stability and properties desirable for printing applications, as described above.

In a further aspect, the present invention provides a method of forming a sintered metal deposit on a substrate, the method comprising: providing a substrate; disposing the sintering composition as described herein onto the substrate; drying the composition at a temperature of from 140° C. to 200° C. to form a dried composition; and sintering the dried composition at a temperature of from 150° C. to 300° C., wherein the sintering is carried out at a temperature higher than the temperature of the drying.

The advantages and preferable features of the other aspects of the invention apply equally to this aspect.

Typically, the drying step serves to remove substantially all of the solvent and other organic substituents of the metal complex, such as the ligands of the metal complex, leaving behind a deposit that is substantially metal, i.e. a deposit consisting essentially of the metal of the metal complex. For example, the dried deposit may contain greater than or equal to 95 wt. % metal, typically greater than or equal to 98 wt. %, the reminder typically being predominantly made up of graphitised carbon. The resulting metal deposit may then be sintered to form a substantially pure sintered metal deposit. The sintering is carried out at a temperature higher than the temperature of the drying so that the metal is preferably not sintered until the drying step is complete. As will be understood by the person skilled in the art, the relative temperatures of the drying and sintering steps will vary depending on the identities of the metal, the solvent and the metal complex of the sintering composition.

Preferably, the substrate is a flexible substrate, preferably comprising one of more of polyethylene terephthalate (PET), polycarbonate (PC), polyimide (PI), thermoplastic polyurethane (TPU), polyethylene naphthalate (PEN) and polyether ether ketone (PEEK). Advantageously, the sintering composition of the present invention enables low enough sintering temperatures to be applied so that damage and/or warping to such substrates may be limited or even avoided. In addition, as discussed above, the sintering composition may form a sintered deposit that is both flexible and exhibits sufficient electrical conductivity.

Alternatively, the substrate may be a rigid substrate, preferably comprising FR4, glass, ceramic, such as $Al_2O_3$, SiC or $SiO_2$, a semiconductor material, such as Si, SiC, Ge or GaN, or a metal foil, such as a metal foil formed of Cu, Ag, Au, Al, Ni or an alloy.

Preferably, disposing the sintering composition onto the substrate comprises stencil printing and/or screen printing the sintering composition onto the substrate. As described herein, the sintering composition of the present invention has desirable properties for printing, such as a suitable viscosity and the substantial absence of any metal particles or particles of the metal complex.

Preferably, either the metal complex of the sintering composition comprises silver, and the drying is carried out at a temperature of from 170° C. to 190° C. for from 30 to 90 minutes; or the metal complex of the sintering composition comprises copper, and the drying is carried out at a temperature of from 150° C. to 170° C. for from 15 to 60 minutes under a nitrogen atmosphere. Preferably, the drying step has temperature and time conditions that are suitable to allow the metal complex to substantially decompose and the solvent and/or ligand of the metal complex to substantially evaporate by the end of the drying step, but substantially without sintering of metal particles. As will be appreciated, higher drying temperatures may require shorter drying times, and vice versa. Use of a nitrogen atmosphere may limit, and preferably prevent, the oxidation of the metal, particularly when the metal is copper.

The sintering is carried out at a temperature of from 150° C. to 300° C. Preferably, the sintering is carried out at a temperature of from 180° C. to 295° C., preferably from 200° C. to 290° C., more preferably from 210° C. to 285° C., even more preferably from 240° C. to 280° C., still even more preferably from 250° C. to 270° C. Such a low sintering temperature has many advantages, including the reduced risk of damage to the substrate in addition to desirable economic benefits. The process may therefore be simpler and also requires less specialist equipment. Temperatures lower than 150° C. may result in inadequate sintering and/or slow sintering.

Typically, the sintering step is performed at a pressure of from 2 MPa to 15 MPa, preferably from 4 MPa to 12 MPa. Such a sintering pressure, in addition to the sintering temperature, may enable a strong metal deposit, with low void percentage, for example, to be formed, thereby enabling the metal to sinter effectively in order to form a sintering joint which may have high die shear strength and high peel strength. Typically, the heat and pressure are simultaneously applied. Typically, the pressure is applied using a Carver press, for example a Carver 3891CEB.4NE1001. Advantageously, the sintering composition described herein may be able to provide a strong sintered joint with few impurities at these low sintering pressures. Such low sintering pressures are desirable in the industry to, among other things, save costs and to reduce potential damage to substrates and/or dies.

The sintered metal deposit may comprise a joint between a die and a substrate, thereby connecting the die and substrate.

Alternatively, the sintered metal deposit may comprise an electrical circuit or an interconnect, e.g. the sintered metal deposit may be an electrical circuit or an interconnect.

The sintered deposit may also comprise a coating, e.g. the sintered deposit may be a coating.

Preferably, the sintered metal deposit is substantially free of metal complex and/or substantially free of organic ligand and/or substantially free of organic material and/or substantially free of carbon. The term "substantially" as used herein means that the joint typically comprises less than or equal to 2 wt. % metal complex and/or organic ligand and/or organic material and/or carbon and preferably less than 1 wt. % metal complex and/or organic ligand and/or organic material and/or carbon, more preferably less than 0.1 wt. % metal complex and/or organic ligand and/or organic material and/or carbon, based on the total weight of the joint. More preferably, the joint is totally free of metal complex and/or organic ligand and/or organic material and/or carbon. Such a joint lacking in impurities may be stronger, i.e. have high die shear strength and high peel strength, as well as show favourable thermal and electrical conductivity properties.

Preferably, the sintered metal deposit has a die shear strength of greater than or equal to 30 MPa, preferably greater than or equal to 40 MPa, and more preferably greater than or equal to 50 MPa. Typically, the die shear strength is measured using a Dage 4000 PXY. The shear strength is typically measured using a shear speed of 700 micron/sec and a shear height of 0 micron.

Typically, after a thermal shock test for 1000 cycles, from +150° C. to −50° C. with a dwell time of 3 minutes, the percentage void in the sintered metal deposit is 0.5% or less, preferably 0.3% or less; and/or after a thermal shock test for 3000 cycles, from +150° C. to −50° C. with a dwell time of 3 minutes, the percentage void in the sintered metal deposit is 1.5% or less, preferably 1.0% or less. The term "thermal shock test" as used herein encompasses a test assessing the damage caused by sudden temperature fluctuations which cause stress in an object. Percentage void is the volume or area percentage, typically area percentage, which is not occupied by material of the sintered joint, i.e. caused by holes and/or air gaps, for example. This may be estimated from the X-ray image of the sintered joint. The percentage void may be measured by X-ray analysis, typically using a Phoenix X-ray (Microme/X-180).

Preferably, the peel strength of the sintered metal deposit is greater than or equal to 10 N/mm, preferably greater than or equal to 15 N/mm, and more preferably greater than or equal to 20 N/mm. Typically, the peel strength is measured using an Imada peel tester, preferably model MX2-110.

Preferably, the sintered metal deposit is solderable and/or high-current capable. High current density carrying capability is defined in relative terms. In this case high current density carrying capability is capability to carry current density higher that other inks such as conventional screen printable conductive inks containing Ag particles or Ag flakes. Such inks printed on thermally insulated substrates can sustain a maximum current density of the order of 10 A/mm$^2$ or less. Even under these low current condition adverse heating and subsequent failure is likely. However, the metallic gels/sintering compositions of the present invention may sustain current densities two to ten times as compared to flake inks, for example greater than 10 A/mm$^2$, or greater than or equal to 15 A/mm$^2$, or greater than or equal to 20 A/mm$^2$, or greater than or equal to 50 A/mm$^2$, or up to 100 A/mm$^2$. These numbers vary depending on the substrate and ambient conditions but relatively these particle free gels sustain much higher current density than the conventional inks filled with Ag or other conducting particles.

Preferably, the sintered metal deposit is flexible. This may enable use of the sintered metal deposit on flexible substrates such as PET and PI, for example, providing a diverse range of applications of the sintered metal deposit.

Preferably, the sintered metal deposit (typically silver deposit) exhibits a sheet resistance of less than 12 mΩ/sq/mil. Such a sintered metal deposit therefore has excellent electrical conductivity and is desirable for use in many applications in the electronics industry. The electrical conductivity, resistivity and sheet resistance may be measured using the four-probe method. In this method, all of the electrical conductivity measurements may be carried out with an Agilent 34411A multimeter. Wires soldered on the pads are connected to the Agilent 34411A multimeter to measure the resistance. Using the resistance value and dimensions of the printed lines, bulk resistivity ($\rho$), sheet resistance ($R_s$) and electrical conductivity ($\sigma$) are obtained using the formulae given below:

Bulk resistivity, $\rho = R \times A/l$],

Sheet resistance, $R_s = R \times W/l$

R=Resistance of the printed and sintered metallic gels

A=width (W)× thickness (t) (of the printed cured line)

l=length of the printed cured line

W=width of the printed cured line

Electrical conductivity ($\sigma$)=1/$\rho$

In a further aspect, the present invention provides a sintered metal deposit formed using the sintering composition described herein, preferably wherein the sintered metal deposit is formed using the method described herein.

The advantages and preferable features of the other aspects of the invention apply equally to this aspect.

Preferably, the sintered metal deposit comprises a joint between a die and a substrate, an electrical circuit or an interconnect, or a coating.

In a further aspect, the present invention provides a method of die attachment, the method comprising: providing a substrate and a die; disposing the sintering composition described herein between the substrate and the die; drying the composition at a temperature of from 140 to 200° C. to form a dried composition; and sintering the dried composition at a temperature of from greater than 150° C. to 300° C. at a pressure of from 2 MPa to 15 MPa to attach the die to the substrate, wherein the sintering is carried out at a temperature higher than the temperature of the drying.

The advantages and preferable features of the other aspects of the invention apply equally to this aspect.

The sintering composition is typically in contact with both the substrate and die. The drying may occur while the sintering composition is between the substrate and die. Alternatively, the sintering composition may be applied to one of the substrate or die, and then dried before being contacted with the other of the substrate or die. In other words, the drying may be carried out when the sintering composition is in contact with both the substrate and the die, or when the sintering composition is in contact with only one of the substrate and the die.

Typically, the drying step serves to remove substantially all of the solvent and other organic substituents of the metal complex, such as the ligands of the metal complex, leaving behind a substantially metal deposit between the substrate and the die, i.e. a deposit consisting essentially of the metal of the metal complex. The resulting metal deposit between the substrate and the die may then be sintered to form a substantially pure sintered metal deposit. The sintering is carried out at a temperature higher than the temperature of the drying so that the metal is preferably not sintered until the drying step is complete. As will be understood by the person skilled in the art, the relative temperatures of the drying and sintering steps will vary depending on the identities of the metal, the solvent and the metal complex of the sintering composition.

The sintering is carried out at a pressure of from 2 MPa to 15 MPa. Preferably, the sintering is carried out at a pressure of from 4 MPa to 12 MPa. Such a sintering pressure, in addition to the sintering temperature, may enable a strong metal deposit, with low void percentage, for example, to be formed, thereby providing a strong substrate-die joint.

In a further aspect, the present invention provides a method of forming an electrical circuit or an interconnect on a substrate, the method comprising: providing a substrate; disposing the sintering composition described herein onto the substrate in the form a circuit or interconnect; drying the composition at a temperature of from 140 to 200° C. to form a dried composition; and sintering the dried composition at a temperature of from 150° C. to 300° C. to form the circuit or interconnect, wherein the sintering is carried out at a temperature higher than the temperature of the drying.

The advantages and preferable features of the other aspects of the invention apply equally to this aspect.

The disposed sintering composition in the form of a circuit or interconnect may be sintered to form a substantially pure sintered metal deposit. The sintering is carried out at a temperature higher than the temperature of the drying so that the metal is preferably not sintered until the drying step is complete. This ensures that sintering only occurs in the substantial absence of organic material, thereby reducing impurities and void formation in the final circuit or interconnect. As will be understood by the person skilled in the art, the relative temperatures of the drying and sintering steps will vary depending on the identities of the metal, the solvent and the metal complex of the sintering composition.

The advantages of the above-described method of die attachment or method of forming an electrical circuit or an interconnect on a substrate are comparable to those of the above-described method of forming a sintered metal deposit on a substrate.

In a further aspect, the present invention provides a method of manufacturing a soldered assembly, the method comprising: forming a sintered metal deposit on a substrate according to the method described herein; depositing a solder paste on the sintered metal; contacting a component with the deposited solder paste; and reflowing the solder paste to provide a soldered assembly.

The advantages and preferable features of the other aspects of the invention apply equally to this aspect.

Typically, the solder paste deposited on the sintered metal is wet, i.e. is molten and contains flux.

The term "substrate" as used herein may encompass substrates such as metallic substrates, for example, copper, direct bond copper (DBC), direct plate copper (DPC), metal core printed circuit boards (MCPCBs), FR4, copper lead frames, flexible PCBs, gold, silver, aluminium, steel and substrates with various surface finishes, such as organic solderability preservative (OSP) and electroless nickel immersion gold (ENIG). Alternatively, other substrates such as non-metallic substrates may be used, such as, for example glass, polymer films, silicone, ceramics and plastics, such as polyimide (PI) or polyethylene terephthalate (PET). In this method, preferably PI, PET or FR4 substrates are used.

Typically, the solder paste is a tin/bismuth solder paste, although other solder pastes may be used. For example, the solder may comprise one of more of SAC solders, ULTS solders, high lead solders, AuSn solders and Zn-based solders.

The soldered assembly may have high temperature applications for wire-harnesses for automotive applications.

Advantageously, the metallic gel disclosed herein may show good wetting properties of solder on the metallic gel printed on the substrate.

Typically, the substrate and sintering composition are pre-dried under nitrogen. Preferably, the solder paste is reflowed under nitrogen or air.

Preferably, the component is selected from an electronic component, an LED and a metallized printed circuit board. Preferably, the substrate is selected from a carrier film, an interposer or a circuit board.

In a further aspect, the present invention provides a use of the above-described sintering composition in a method selected from: die attachment, wafer-to-wafer bonding, hermetic and near hermetic sealing, dispensing and the production of circuitry or interconnect lines.

The advantages and preferable features of the other aspects of the invention apply equally to this aspect.

The sintering composition described herein may be particularly effective in these applications due to the advantageous properties of the sintering composition and resulting sintered metal deposit described herein.

In a further aspect, the present invention provides a use of the sintering composition described herein in any of the methods described herein to produce electrical/electronic devices, interconnects, assemblies, circuits or printed cables and wire harnesses.

The advantages and preferable features of the other aspects of the invention apply equally to this aspect.

Preferably, the assemblies and/or circuits are flexible or thermoformed and/or injection molded 3D electronic structures. Preferably, the assemblies and/or circuits are solderable and can carry high current density.

The invention will now be described in relation to the following non-limiting Figures, in which.

Figure 1A:
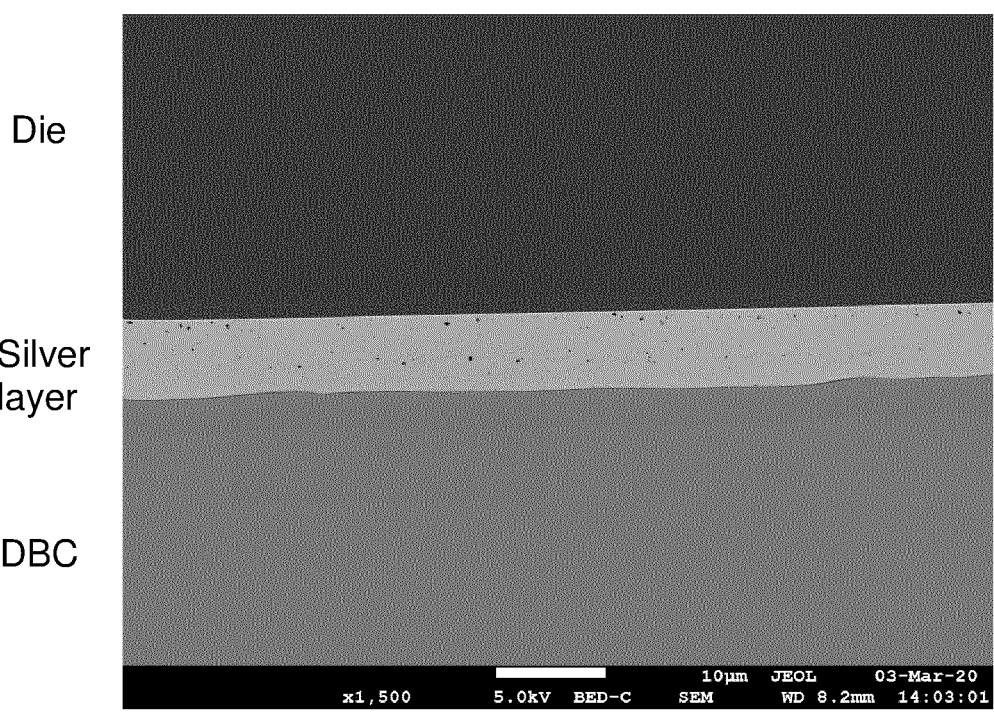
FIGS. 1a and 1b show an FESEM cross-section of joints made using a metallic gel according to the present invention.

The invention will now be described in relation to the following non-limiting examples.

Materials and Equipment:

Materials:

Silver neodecanoate, 95%, was purchased from Gelest INC.

Propane-1, 2-diol, tri-ethylene glycol and 2-Methyl 1-3 propanediol were purchased from SDFCL.

Terpineol (mixture of isomers) was purchased from Loba chemie.

Copper (II) formate tetrahydrate was purchased from Alfa Aesar. 3-(Dimethylamino)-1,2-propanediol was purchased from Tokyo Chemical Industry.

Glycerol (98%) was purchased from Merck.

1-ethyl-2-pyrrolidinone was purchased from Advent.

All of the above materials are analytical grade reagents and were used without any further purification.

17                                                                                    18

Equipment:

Die shear was performed on a Dage 4000 PXY.

Die attachment was performed on a Carver (3891CEB.4NE1001).

Viscosity was measured with a Brookfield viscometer (HB DV-III) Spindle CP51.

X-ray analysis was done in a Phoenix X-ray (Microme/X-180).

Peel strength was done with an IMADA peel tester (model MX2-110).

EXPERIMENTAL

(1) Synthesis of Silver Metallic Gel

Example 1-I 12 g of silver neodecanoate was weighed into a two-neck round bottom flask equipped with thermometer and condenser. To the silver precursor, 4.05 g of terpineol and 0.45 g propane-1-2-diol were added. The reaction mixture was then heated at 85° C. with constant stirring until all of the silver neodecanoate was fully dissolved. The resultant mixture was then allowed to cool and was then milled to get a homogenous metallic gel. As silver compounds are very much photosensitive, the particle free metallic gel was kept in an opaque or amber coloured bottle under refrigerated conditions. The results are shown in Table 1.

TABLE 1

| Component | Weight % |
| --- | --- |
| Silver neodecanoate | 72.73 |
| Propane-1-2-diol | 2.72 |
| Terpineol | 24.55 |

Example 1-II 12 g of silver neodecanoate was weighed into a two-neck round bottom flask equipped with thermometer and condenser. To the silver precursor, 4 g of terpineol was added. The reaction mixture was then heated at 85° C. with constant stirring until all of the silver neodecanoate was fully dissolved. The resultant mixture was then allowed to cool and was then milled to get a homogenous metallic gel. As silver compounds are very much photosensitive, the particle free metallic gel paste was kept in an opaque or amber coloured bottle under refrigerated conditions. The results are shown in Table 2.

TABLE 2

| Component | Weight % |
| --- | --- |
| Silver Neodecanoate | 75 |
| Terpineol | 25 |

The metal content of the metallic gel can be varied by varying the weight percentage of the silver precursor in the formulation.

Example 1-III 12 g of silver neodecanoate was weighed into a two-neck round bottom flask equipped with thermometer and condenser. To the silver precursor, 2.25 g of terpineol and 2.25 g of trigol were added. The reaction mixture was then heated at 85° C. with constant stirring until all of the silver neodecanoate was fully dissolved. The resultant mixture was then allowed to cool and was then milled to get a homogenous metallic gel. The metallic gel was kept in an amber coloured bottle in refrigerated conditions. The results are shown in Table 3.

TABLE 3

| Component | Weight % |
| --- | --- |
| Silver precursor | 72.72 |
| Terpineol | 13.64 |
| Trigol | 13.64 |

Example 1-IV 12 g of silver neodecanoate was weighed into a two-neck round bottom flask equipped with thermometer and condenser. To the silver precursor, 2.25 g of terpineol and 2.25 g of 2-methyl-1,3-propanediol were added. The reaction mixture was then heated at 85° C. with constant stirring until all of the silver neodecanoate was fully dissolved. The resultant mixture was then allowed to cool and was then milled to get a homogenous metallic gel. The results are shown in Table 4.

TABLE 4

| Component | Weight % |
| --- | --- |
| Silver precursor | 72.72 |
| Terpineol | 13.64 |
| 2-Methyl 1-3 propanediol | 13.64 |

(2) Synthesis of Metallo-Organic Paste

Example 2-I 9.2 g of silver neodecanoate was weighed in a container. To which 2.25 g of tri-ethylene glycol was added. The mixture was then mixed in a planetary mixer at 1000 rpm for 1 minute. The slurry was then milled to obtain a homogenous paste. The paste was kept in an amber coloured bottle in refrigerated conditions. The results are shown in Table 5.

TABLE 5

| Component | Weight % |
| --- | --- |
| Silver precursor | 80.35 |
| Tri-ethylene glycol | 19.65 |

Metallic Gel and its Form Factors:

Thermal Characterization:

Thermogravimetric analysis (TGA) of the particle free molecular paste or metallic gel showed the complete evaporation of solvents and decomposition of the metal-organic precursor below 250° C. Total weight loss of 72% at 250° C. reveals the fact that on heating the metallic gel at 250° C., the organic moieties fully detached from the elemental silver and evaporated off leaving no carbon residue but only bulk silver metal. Thus, the thermal decomposition of the silver precursor leads to the deposition of only pure silver metal with no carbon residue. At TGA at temperatures above 250° C., the percentage residue is close to the theoretical weight percentage of silver in silver neodecanoate (28 wt. %) based on the chemical formula. This apparently indicates that thermal decomposition of the silver neodecanoate has completely taken place, leaving only pure silver.

Differential scanning calorimetry (DSC) of the particle free metallic gel showed an endothermic peak at 100-120° C. which indicates melting of the isomers of silver neodecanaote along with the slow evaporation of the solvents. The isomers of silver neodecanoate undergo a solid to liquid phase transition prior to the thermal decomposition which occurs above 200° C. Two exothermic peaks at 205° C. and 228° C. in the DSC indicate that the decomposition of the silver precursor is a two-step decomposition process.

Viscosity and Stability of the Paste:

The viscosity of the paste was measured using a Brookfield viscometer (HB DV-III) Spindle CP51 at 1 rpm. The viscosity of the paste was 76 Pa·s. The viscosity was measured at each alternative day. There was no change in the viscosity of the paste after 1 month of manufacturing, indicating the good stability of the paste.

Particle Free Molecular Paste or Metallic Gel; Form Factors and its Application in Die Attachment:

(i) Printing Paste and its Application in Die Attachment:

The attachment of semiconductor or other die elements can be accomplished by printing the metallic gel or particle free molecular paste on to the substrates such as DBC (Direct Bond Copper), DPC (Direct Plate Copper), MCPCB (Metal Core PCBs), FR4, Copper lead-frames, flexible PCBs with the help of a DEK printer.

The printed substrate was dried at 180° C. for 60 minutes in air. The pre-dried material is then allowed to cool at normal room temperature. Our study has shown that the pre-dried print material does not contain any organic impurity obtained from the decomposing reaction of the metal precursor. The complete removal of the organic impurity before the die placement provides a carbon free joint between the die and substrate. Die elements such as gold coated Si dies and Ag ribbons were placed on the pre-dried printed area. The assembly was then wrapped in an aluminium foil. The vehicle was then subjected to 260° C. at 10 MPa pressure for 1 minute in Carver press.

The assembled samples were then subjected to X-ray analysis for void measurement. An X-ray of the assembled samples showed a void of <1%. The low percentage void can be attributed to the wetting of die and substrate surfaces due to the solid to liquid phase transition before decomposition of the silver precursor.

Figure 1B:
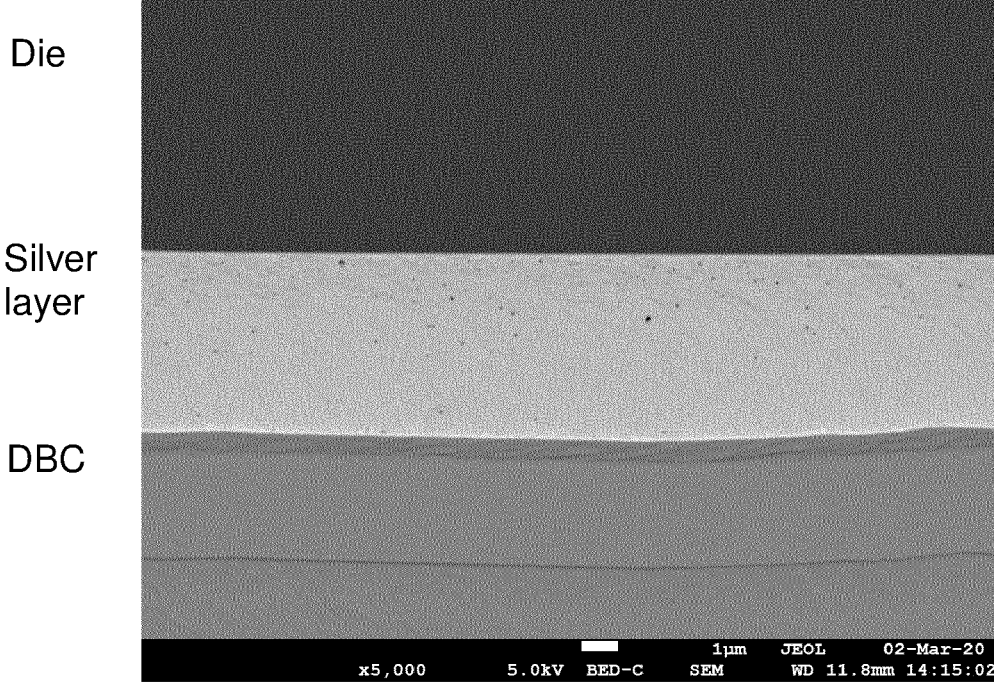

FIGS. 1a and 1b show FESEM micrographs of the cross-section of the assembled samples. The SEM cross-section shows a good densification of silver. The SEM cross-section also reveals good diffusion of silver to die and also on the substrate interface, which of course is the contributing factor for the higher joint strength. The bond-line thickness measured varies from 2.5 microns to 3 microns.

The joint strength of the assembled samples was evaluated using Dage Die shear machine. The assembled 3 mm*3 mm Au coated Si dies show a joint strength>50 MPa. The die shear value could not be exactly quantified as because part of the dies was shattering and the majority of the die was stuck to the substrate. Data were also collected for high temperature die shear done at 260° C. It was seen that there was no deterioration in joint strength when the die shear was done at higher temperature.

Figure 2A:
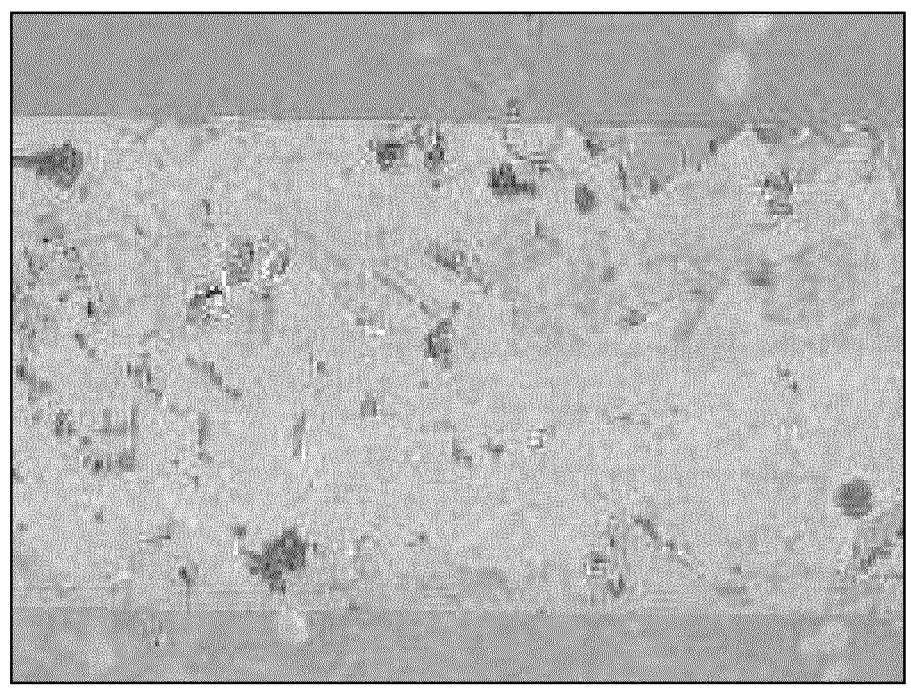
FIG. 2a shows a microscopic image of a failure mode on the substrate side of an assembled sample according to an embodiment of the present invention.
Figure 2B:
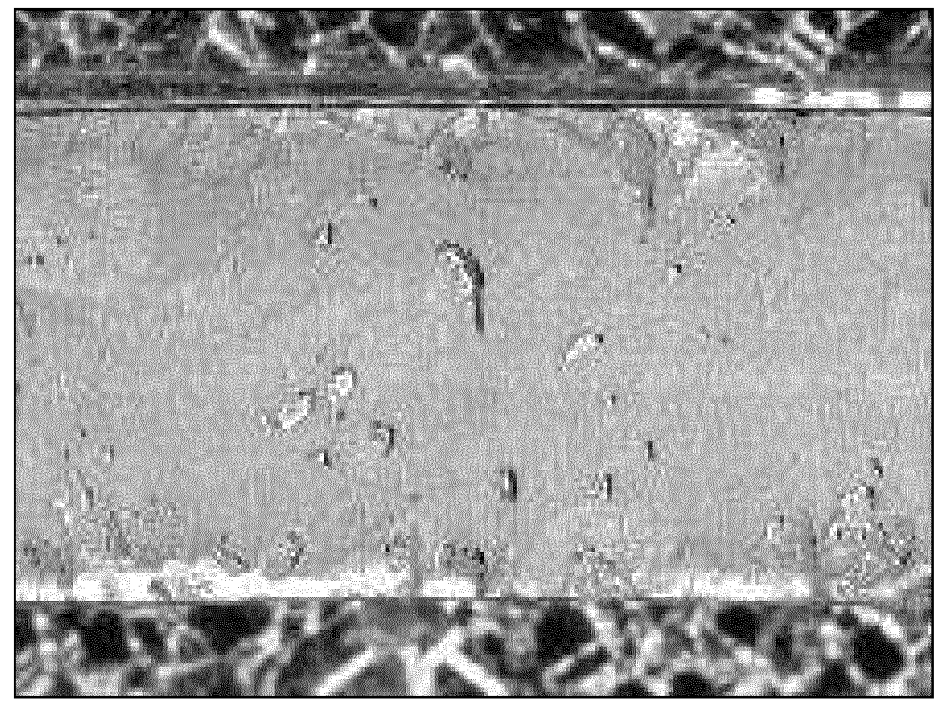
FIG. 2b shows a microscopic image of a failure mode on the ribbon side of an assembled sample according to an embodiment of the present invention.

Joint strength was further evaluated by measuring the peel strength of the Ag ribbon (2 mm width and 85 microns thick) attached to gold coated DBC substrate using IMADA peel tester. The peel strength obtained was much stronger than the joints made by the reported nanoparticle based interconnect material. The failure mode of the joints shows a bulk failure. Microscopic images (FIGS. 2a and 2b) show a diffused layer of silver both on the silver ribbon and DBC side.

Figure 3A:
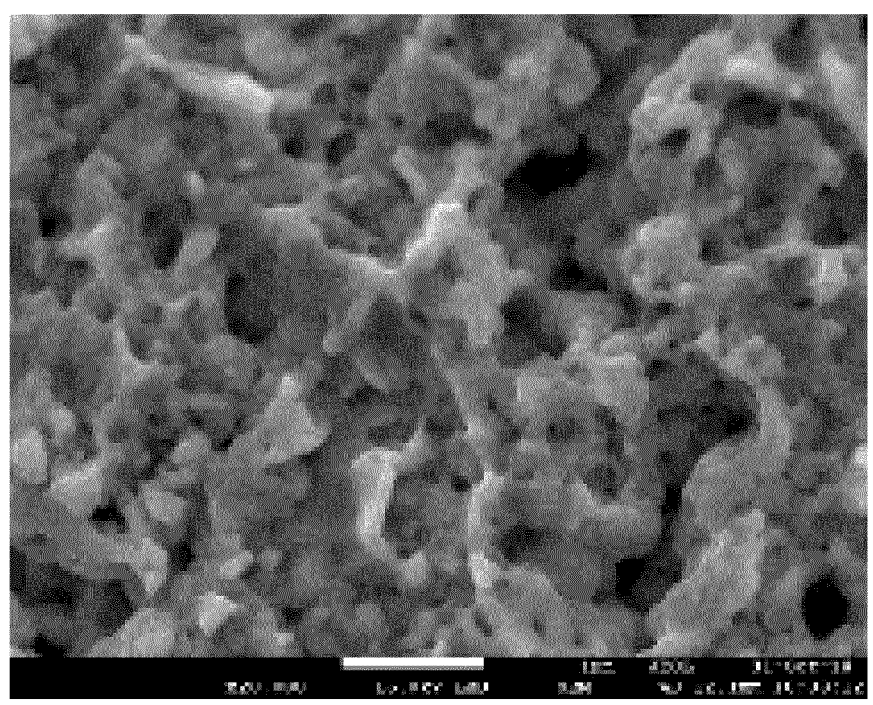
FIG. 3a shows an FESEM micrograph of a failure mode on the substrate side of an assembled sample according to an embodiment of the present invention.
Figure 3B:
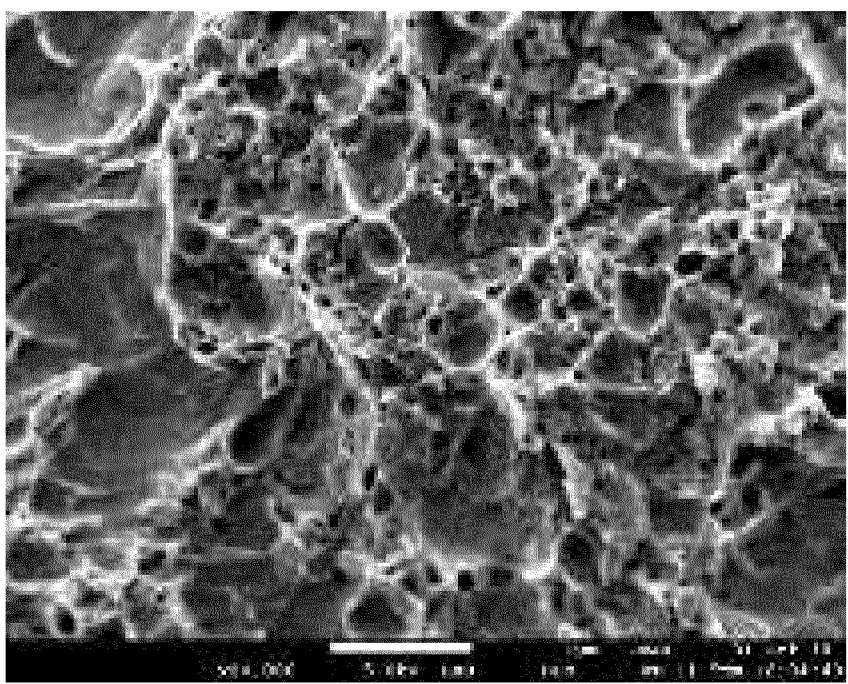
FIG. 3b shows an FESEM micrograph of a failure mode on the ribbon side of an assembled sample according to an embodiment of the present invention.

The microstructure of the diffused layer of silver on both the interfaces was analyzed using FESEM. Micrographs of FESEM (FIGS. 3a and 3b) show the diffused silver layer on the surface of ribbon and DBC has an elongated spike like structure. This reveals the fact that the peeling off the ribbon from the substrate has created a huge stress on the diffused silver layers of ribbon and DBC which made the silver layer to protrude out of the surfaces.

Figure 4A:
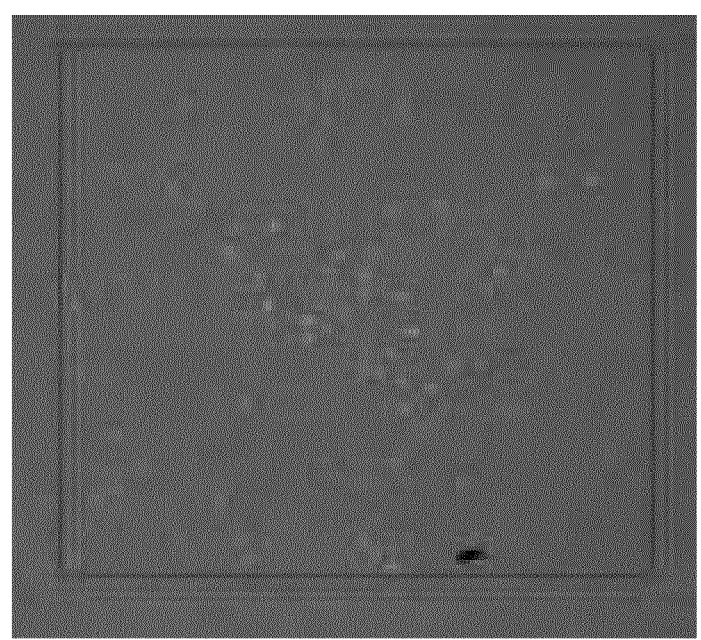
FIG. 4a shows X-ray analysis of the percentage void of an assembled sample according to an embodiment of the present invention after being subjected to a thermal shock test for 0 cycles.
Figure 4B:
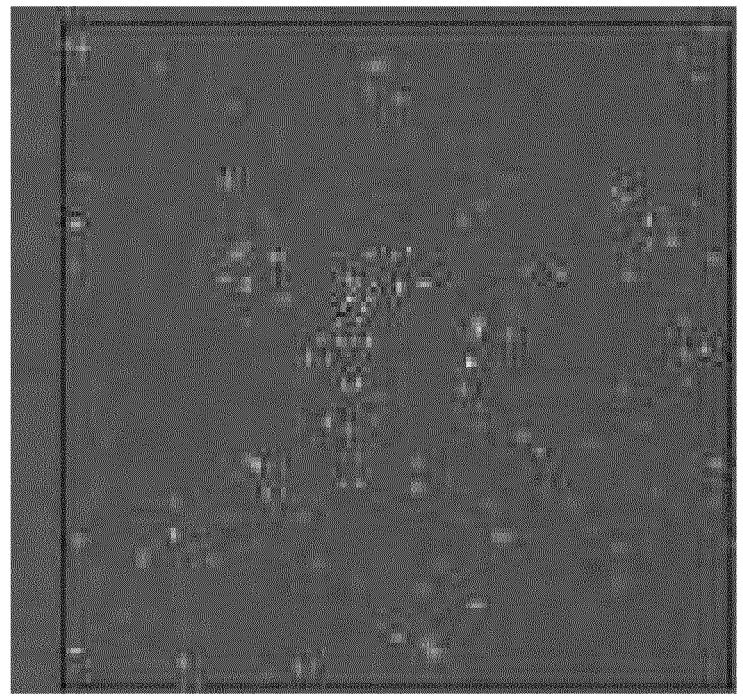
FIG. 4b shows X-ray analysis of the percentage void of an assembled sample according to an embodiment of the present invention after being subjected to a thermal shock test for 1000 cycles.
Figure 4C:
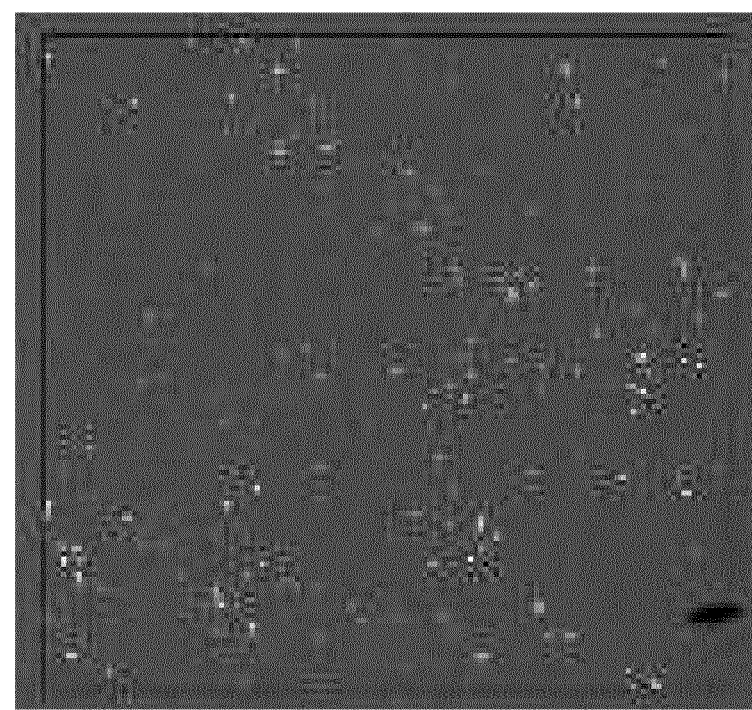
FIG. 4c shows X-ray analysis of the percentage void of an assembled sample according to an embodiment of the present invention after being subjected to a thermal shock test for 3000 cycles.

The assembled samples were subjected to a thermal shock test for 1000 cycles (+150 to −50° C. dwell time of 3 minutes) for 3000 cycles. X-ray analysis shows that the percentage void slowly increases from 0.3 to 1% with increasing number of thermal shock cycles (FIGS. 4a, 4b, and 4c).

Figure 5A:
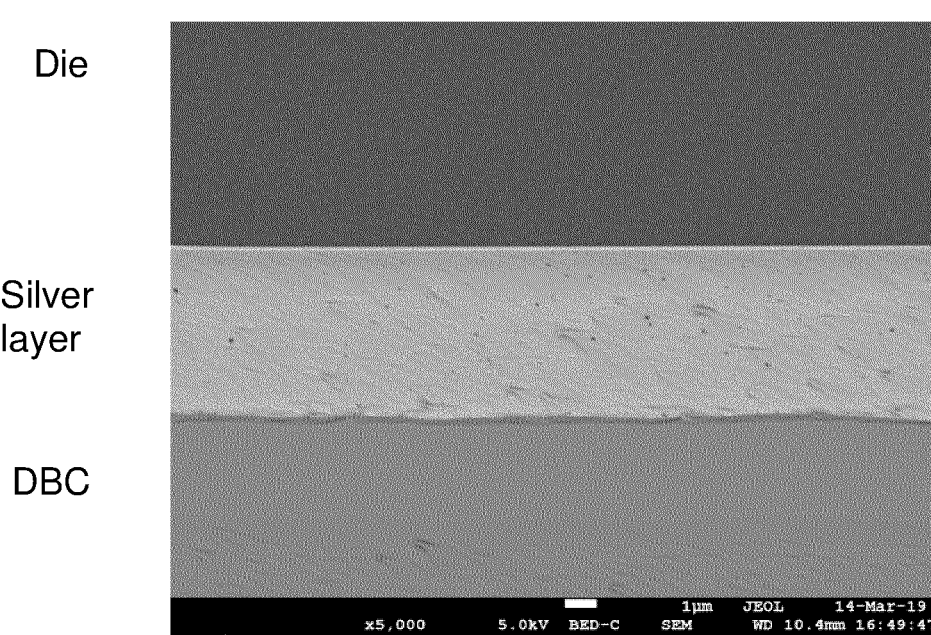
FIGS. 5a, 5b and 5c show FESEM cross-sections of assembled samples according to embodiments of the present invention after being subjected to a thermal shock test for 3000 cycles.
Figure 5B:
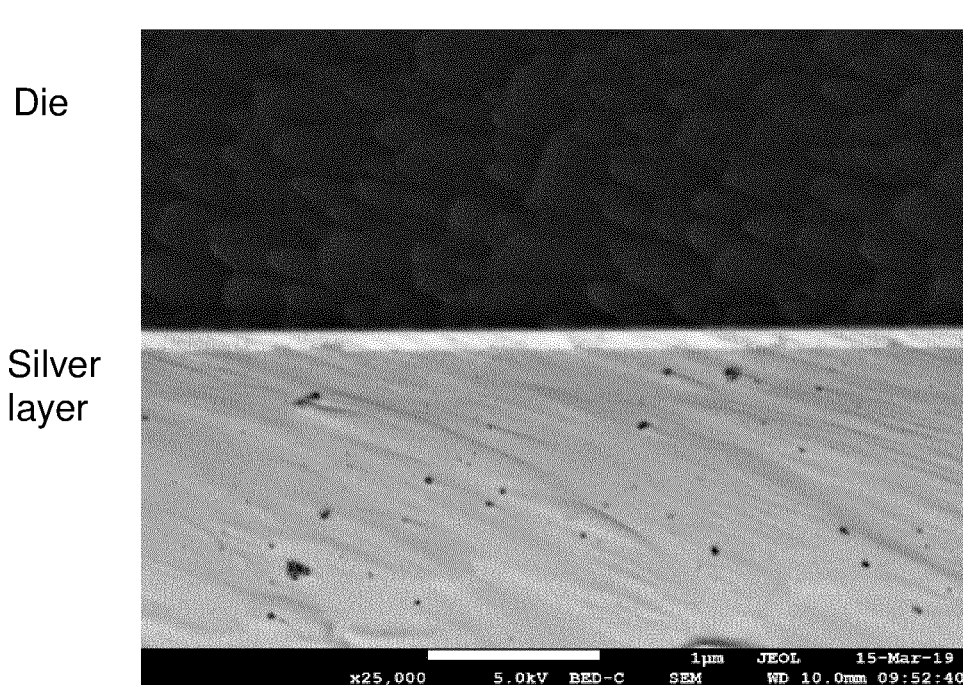
Figure 5C:
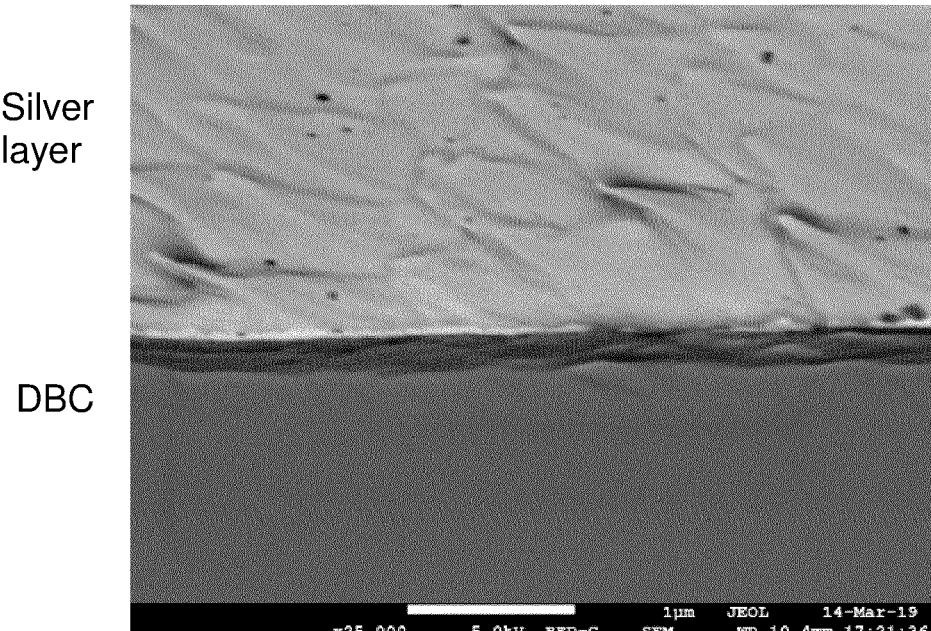

It was observed that there was no deterioration in die shear strength after completion of 3000 cycles. It was seen that during die shear most part of the die was shattered and was stuck to the substrate after 3000 cycles, which reveals the excellent joint strength. FIGS. 5a, 5b and 5c show the FESEM cross-sections of the 3000TS. The cross-sections reveal a good diffusion of silver layer at both the interfaces with no cracks within the silver layer and interfaces.

Our study shows that with increase in sintering pressure and sintering time, the peel strength increases. In case of low pressure die attachment, higher joint strength can be achieved by increasing the sintering time. In our case, a maximum of 20 N/mm can be achieved at 300° C. at 10 MPa for 1 minute. Table 6 shows the peel strength at different sintering pressure and temperature.

TABLE 6

| | Sintering Time (sec) | Peel Strength (N/mm) |
| --- | --- | --- |
| Sintering Temperature @ 10 MPa | | |
| 300 | 60 | 17-20 |
| 300 | 30 | 17-20 |
| 300 | 15 | 12-17 |
| 260 | 60 | 15-18 |
| 260 | 30 | 10-14 |
| 200 | 60 | 10-14 |
| 200 | 30 | 7-10 |
| Sintering Temperature @ 6 MPa | | |
| 300 | 60 | 9-12 |
| 300 | 30 | 9-11 |
| 300 | 15 | 8-10 |
| 260 | 60 | 9-12 |
| 260 | 30 | 7-8 |
| 200 | 120 | <4 |
| 200 | 90 | No strength |

(ii) Free Standing Silver Film/Foil and its Application in Die Attachment:

Preparation of Free Standing Silver Films:

The particle free molecular paste was printed on glass substrate. The printed glass substrate was then heated at 150° C. for 140 minutes. It was then allowed to cool at room temperature. The glass substrate was then dipped in a water bath for 10 minutes. This allows the print to detach itself from the glass. The thin silver film was then dried at room temperature for 60 minutes. The thickness of the silver film varies with the thickness of the stencil. Basically, a silver film of thickness which varies from 3 microns to 15 microns was synthesised. The synthesised silver films are flexible and further, these films were used for die attach applications.

The synthesised film can be used as a die attach interconnect material. The film was placed as interconnect material between the die (3*3 mm Au coated Si die) and substrate (gold coated DBC). The assembled sample was then wrapped in an aluminium foil and then subjected to 260° C. at 6 MPa pressure for 1 minute in Carver press. X-ray analysis showed that the assembled sample did not show the presence of any void.

The die shear obtained was around 40 MPa. The failure mode obtained was an interfacial failure. A diffused layer of silver was seen on the die side but no layer of silver is seen on the substrate side.

Wafer Lamination and its Application in Die Attachment:

Particle free molecular paste was printed on Au coated 2" silicon wafer using a DEK printer. The printed wafer was then allowed to dry at 180° C. for 75 minutes in a box oven. The laminated wafer was then mounted on a UV tape and diced using ADT 7100 dicing machine. The coated singulated die was then used for die attach in Au coated DBC using Datacon die bonder. The UV tape did not show any remains of the silver coating on the UV tape. The coated Si die was then attached to the DBC substrate at 250° C. using a sintering pressure of 6 MPa for 1 minute.

X-ray analysis revealed the presence of 0.3% void. The joint strength of the assembled sample at 250° C. at 6 MPa sintering pressure was around 40 MPa. Failure mode analysis of the assembled sample showed a bulk failure.

Figure 6A:
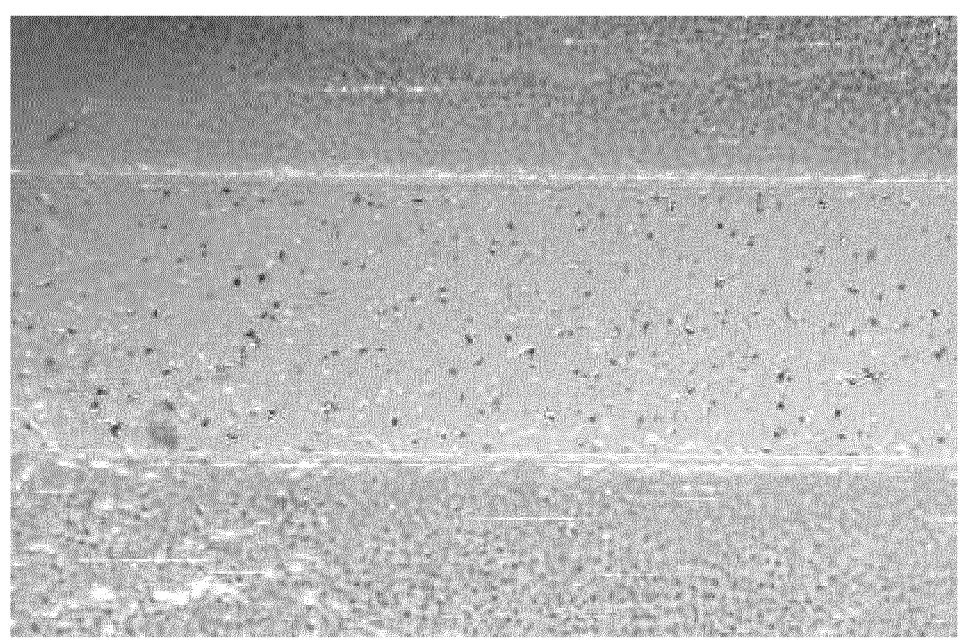
FIG. 6a shows a peel strength failure mode on the DBC side of an assembled sample in accordance with an embodiment of the present invention.
Figure 6B:
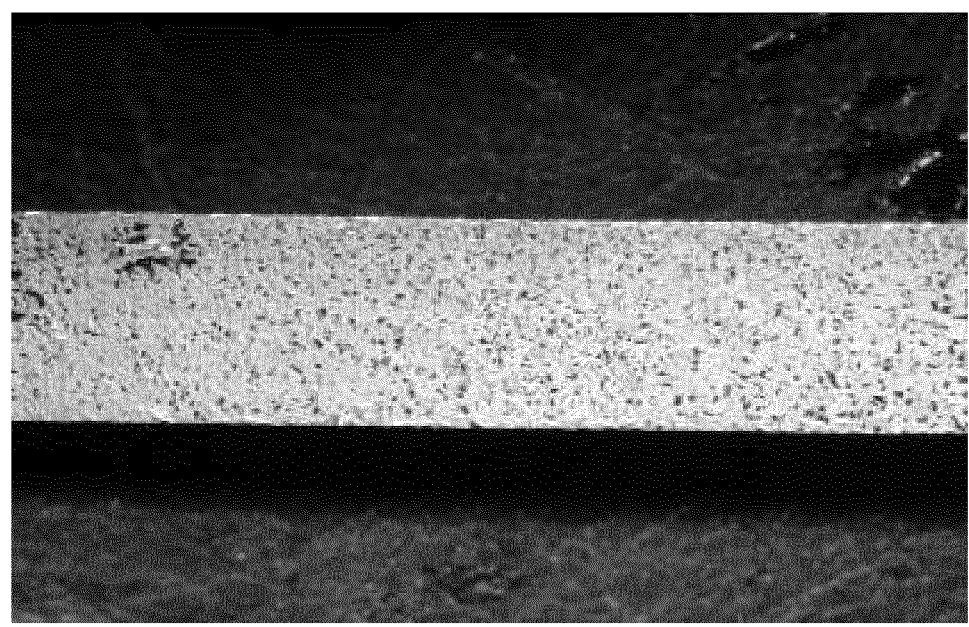
FIG. 6b shows a peel strength failure mode on the ribbon side of an assembled sample in accordance with an embodiment of the present invention.

Metalorganic Paste, Die Attach Application:

The invented metalorganic paste was printed on a DBC. The printed substrate was dried at 180° C. for 60 minutes. The pre-dried material was then allowed to cool at normal room temperature. Die elements such as gold coated Si dies and Ag ribbons were placed on the pre-dried printed area. The assembly was then wrapped in an aluminium foil. The vehicle was then subjected to 260° C. at 10 MPa pressure for 1 minute in a Carver press. The joint strength of the assembled samples was evaluated using a Dage Die shear machine. The assembled 3 mm*3 mm Au coated Si dies show a joint strength>50 MPa. The die shear value could not be exactly quantified as because part of the dies were shattering and most of the die was stuck to the substrate. Joint strength was further evaluated by measuring the peel strength of the Ag ribbon (2 mm width and 85 micron thick) attached to gold coated DBC substrate using IMADA peel tester. The peel strength obtained was around 8-10 N/mm. The failure mode of the joints shows a bulk failure as shown in FIGS. 6a and 6b.

Figure 9A:
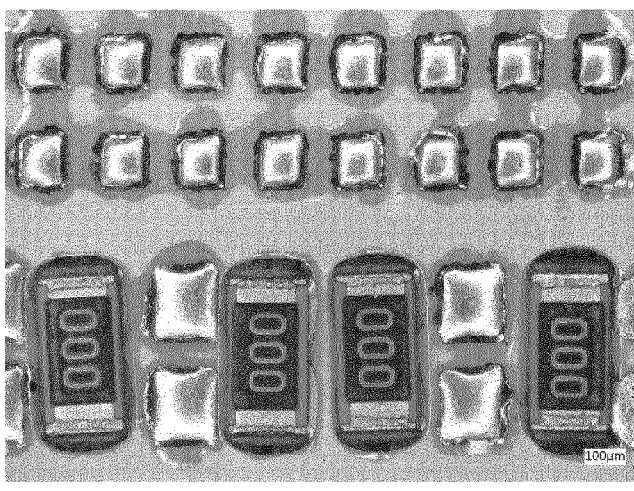
FIGS. 9a-9c show images of SnBi solder paste printed and reflowed under nitrogen/air on the printed surface of a metallic gel according to the present invention, which was printed on an FR4/PI substrate.
Figure 9B:
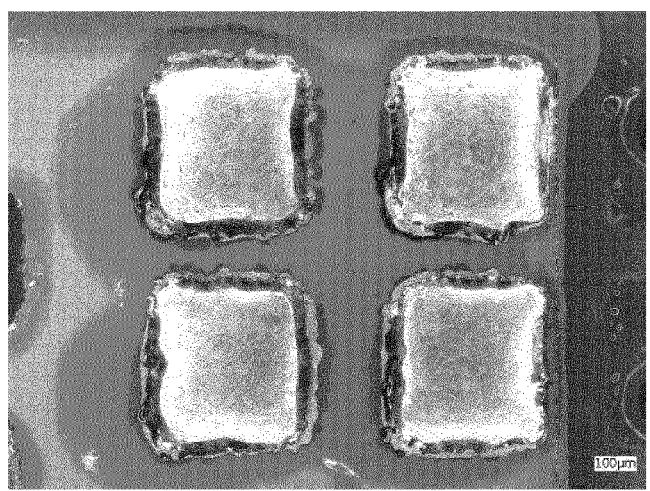
Figure 9C:
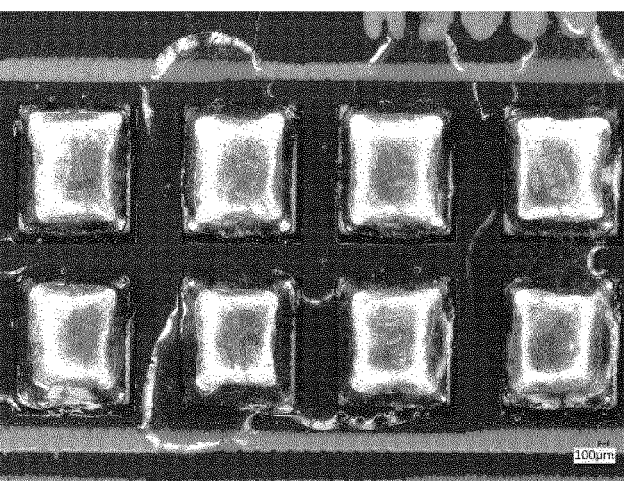

Soldering on Silver Metallic Gel:

The disclosure also reveals the soldering on metallic gel. It has been seen that the invented metallic gel has 5B addition to PI, PET, FR4, glass, ceramic, metal and polymeric substrates. In the current invention, the metallic gel was printed on a FR4/polyimide substrate which was then cured at 180° C. for 1 hour. On the printed surface of the metallic gel, (Sn/Bi) solder paste was printed and reflowed under nitrogen/air. Good wetting properties of solder on metallic gel printed on the polymeric substrate were seen (see FIGS. 9a-9c).

Figure 7A:
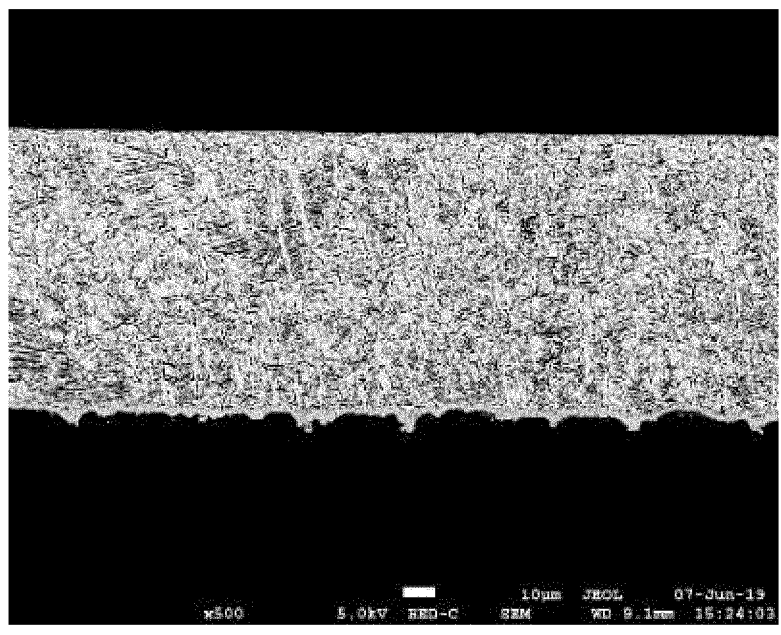
FIGS. 7a, 7b and 7c show SEM cross-sections of the soldering on a metallic gel on an FR4 substrate in accordance with an embodiment of the present invention.
Figure 7B:
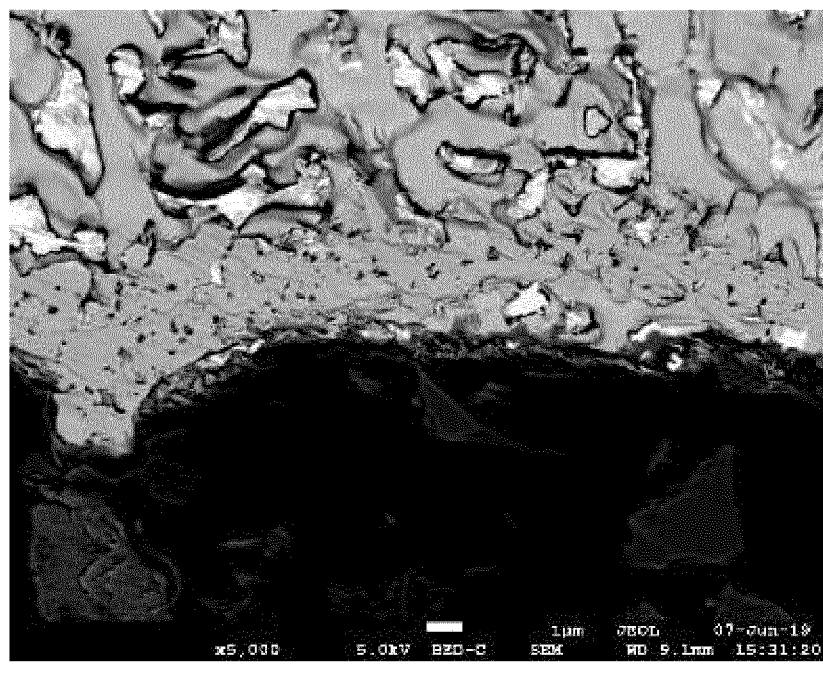
Figure 7C:
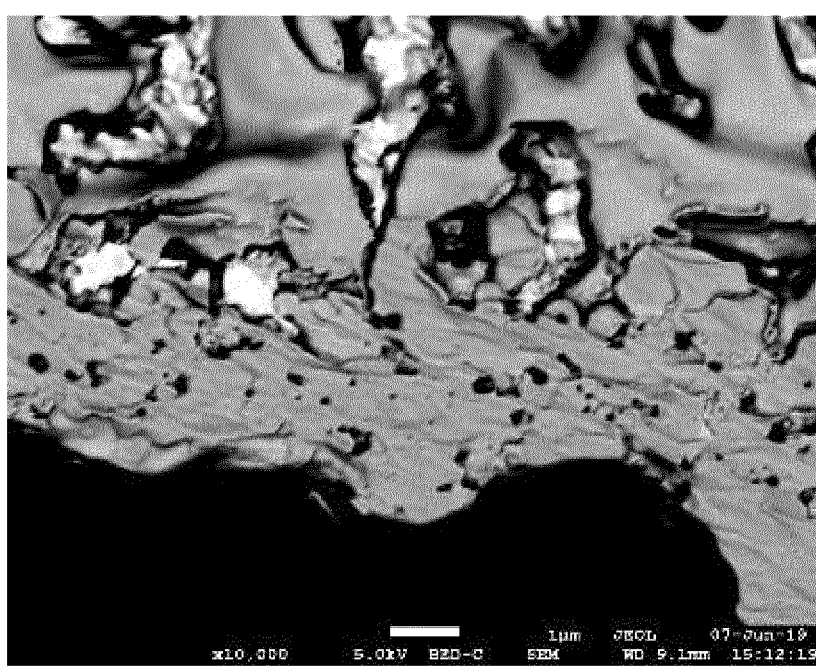
Figure 8A:
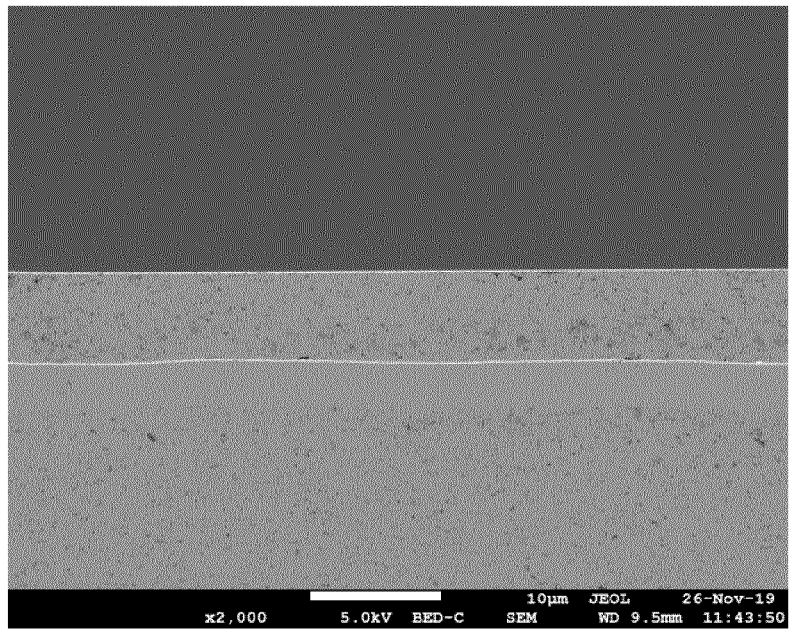
FIG. 8a shows an FESEM cross-section of an assembled sample in accordance with an embodiment of the present invention.
Figure 8B:
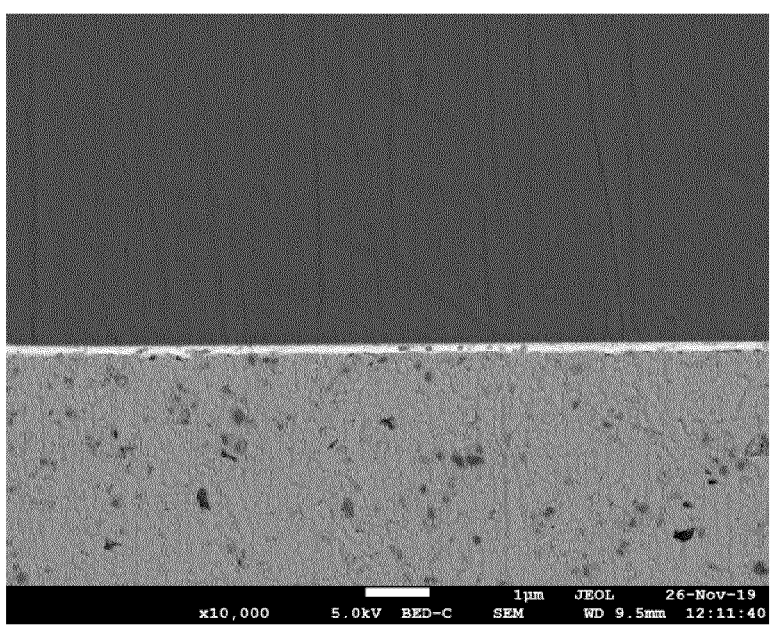
FIGS. 8b and 8c show FESEM cross-sections of the die interface of assembled samples in accordance with an embodiment of the present invention.
Figure 8C:
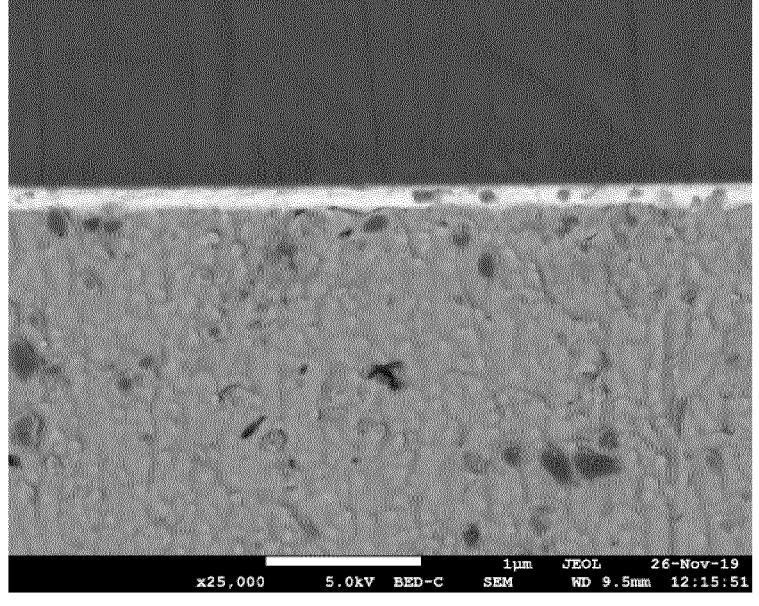
Figure 8D:
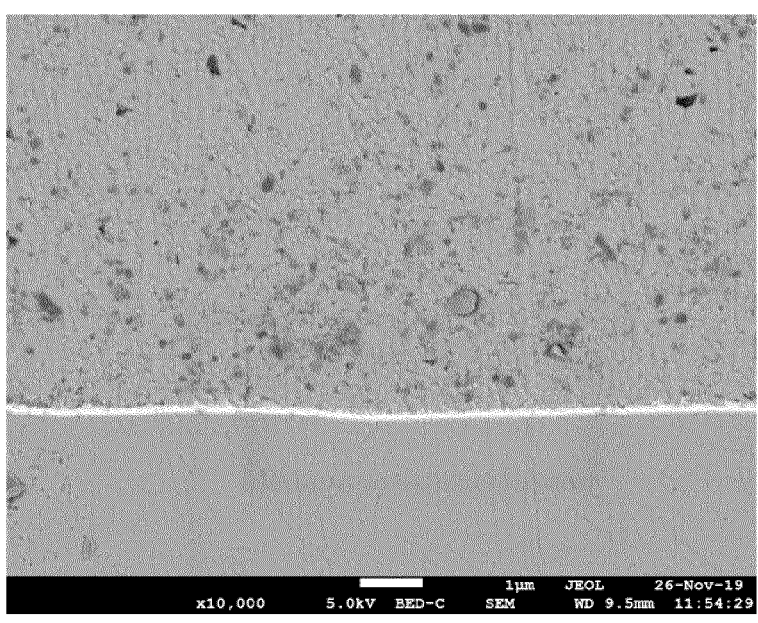
FIGS. 8d and 8e show FESEM cross-sections of the substrate interface of assembled samples in accordance with an embodiment of the present invention.
Figure 8E:
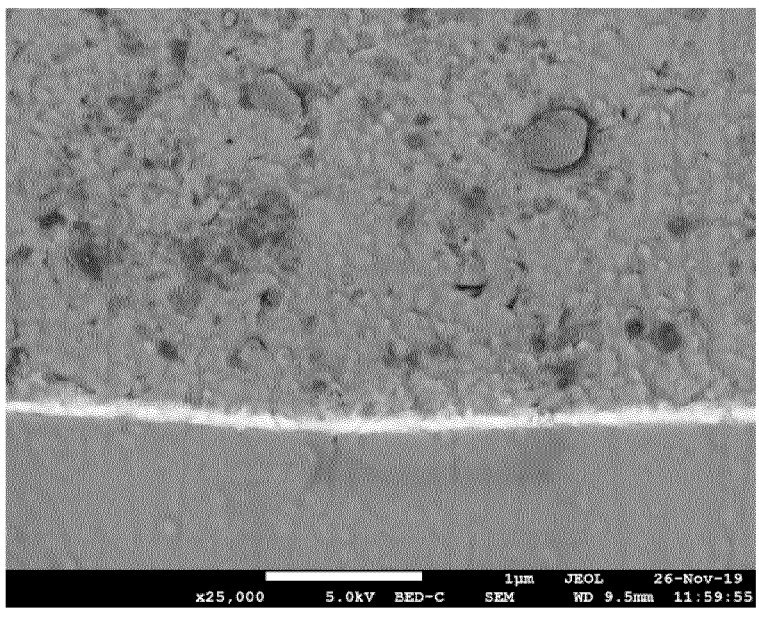

The soldered assembly was cross-sectioned for a FESEM micrograph. From FIGS. 7a, 7b and 7c, it can be easily seen that the solder paste nicely diffuses through the metallic gel layer and no cracks were also seen at the solder and gel interface. EDAX done at the interfaces shows almost 70%

Ag and 30% (wt/wt) Sn. The percentage composition clearly reveals the formation of $Ag_3Sn$.

(3) Synthesis of Copper Metallic Gel

Example 3-I 5 g copper (II) formate tetrahydrate was weighed and 0.2 g 3-(dimethylamino)-1,2-propanediol was added to it. This mixture was then heated at 130° C. with occasional stirring for 10 minutes and it was then cooled to room temperature. 0.03 g silver neodecanoate and 1 g glycerol were then added to the previous mixture and it was then mixed for 2-3 minutes. The whole mixture was then milled in a three roll mill and it was then homogenized in an orbital mixture at 1000 RPM for 10 minutes.

Example 3-II 5 g copper (II) formate tetrahydrate was weighed and 0.2 g 3-(dimethylamino)-1,2-propanediol was added to it. This mixture was then heated at 130° C. with occasional stirring for 10 minutes and it was then cooled to room temperature. 0.7 g glycerol and 0.3 g diethylene glycol monomethyl ether were then added to the previous mixture and it was then mixed for 2-3 minutes. The whole mixture was then milled in a three roll mill and it was then homogenized in an orbital mixture at 1000 RPM for 10 minutes.

Example 3-III 5 g copper (II) formate tetrahydrate was weighed and 0.2 g 3-(dimethylamino)-1,2-propanediol was added to it. This mixture was then heated at 130° C. with occasional stirring for 10 minutes and it was then cooled to room temperature. 1 g terpeneol was then added to the previous mixture and it was then mixed for 2-3 minutes. The whole mixture was then milled in a three roll mill and it was then homogenized in an orbital mixture at 1000 RPM for 10 minutes.

Example 3-IV 5 g copper (II) formate tetrahydrate was weighed and 0.2 g 3-(dimethylamino)-1,2-propanediol was added to it. This mixture was then heated at 130° C. with occasional stirring for 10 minutes and it was then cooled to room temperature. 1 g glycerol was then added to the previous mixture and it was then mixed for 2-3 minutes. The whole mixture was then milled in a three roll mill and it was then homogenized in an orbital mixture at 1000 RPM for 10 minutes.

Example 3-V 5 g copper (II) formate tetrahydrate was weighed and 0.2 g 3-(dimethylamino)-1,2-propanediol was added to it. This mixture was then heated at 130° C. with occasional stirring for 10 minutes and it was then cooled to room temperature. 0.5 g glycerol was then added to the previous mixture and it was then mixed for 2-3 minutes. The whole mixture was then milled in a three roll mill and it was then homogenized in an orbital mixture at 1000 RPM for 10 minutes.

Example 3-VI 4.5 g copper (II) formate tetrahydrate was weighed and 0.2 g 3-(dimethylamino)-1,2-propanediol was added to it. This mixture was then heated at 130° C. with occasional stirring for 10 minutes and it was then cooled to room temperature. 0.5 g Cu nano powder and 1 g glycerol were then added to the previous mixture and it was then mixed for 2-3 minutes. The whole mixture was then milled in a three roll mill and it was then homogenized in an orbital mixture at 1000 RPM for 10 minutes.

Example 3-VII 8 g silver metallic gel (see section (1) of Experimental section) and 2 g of Example 3-IV were weighed and then mixed and homogenized using an orbital mixture for 3 times at 1000 RPM for 1 minute.

Example 3-VIII 5 g copper (II) formate tetrahydrate was weighed; 0.2 g 3-(dimethylamino)-1,2-propanediol was added to it. This mixture was then heated at 130° C. with occasional stirring for 10 minutes and it was then cooled to room temperature. 1 g glycerol and 0.31 g 1-ethyl-2-pyrrolidinone were then added to the previous mixture and it was then mixed for 2-3 minutes. The whole mixture was then milled in a three roll mill and it was then homogenized in an orbital mixture at 1000 RPM for 1 minute.

Example 3-IX 5 g copper (II) formate tetrahydrate was weighed; 0.2 g 3-(dimethylamino)-1,2-propanediol was added to it. This mixture was then heated at 130° C. with occasional stirring for 10 minutes and it was then cooled to room temperature. 1 g 1-ethyl-2-pyrrolidinone was then added to the previous mixture and it was then mixed for 2-3 minutes. The whole mixture was then milled in a three roll mill and it was then homogenized in an orbital mixture at 1000 RPM for 1 minute.

Copper Gel, Die Attach Application:

Copper gel was printed on a DBC. The printed substrate was then dried at 160° C. for 30 minutes in nitrogen atmosphere. The pre-dried material was then allowed to cool at room temperature. Die elements such as gold coated Si dies were placed on the pre-dried printed area. The assembly was then wrapped in an aluminium foil with a graphite sheet for cushioning effect. The vehicle was then subjected to 260° C. at 10 MPa pressure for 2 minutes in a Carver press. The joint strength of the assembled samples was evaluated using a Dage Die shear machine. The assembled 3 mm*3 mm Au coated Si dies show a joint strength>70 MPa. The die shear value could not be exactly quantified because part of the dies shattered and most of the die was stuck to the substrate.

FESEM micrographs of the cross-section of the assembled samples (FIGS. 8a-e) show a good densification of copper. SEM cross-section also reveals good diffusion of copper to die and on the substrate interface, which of course is the contributing factor for the higher joint strength. The bond-line thickness for a print using 200 micron stencil is around 11 microns.

Soldering on Copper Metallic Gel:

It has been seen that the invented metallic copper gel has good addition to PI, PET and FR4 substrates if it is laminated at a minimum pressure of 5 MPa at 150-200° C. In the current invention, the copper gel was printed on a FR4/polyimide substrate which was then pre-dried at 160° C. for 30 minutes under nitrogen, then laminated in a Carver press at 5 MPa pressure at 200° C. (PI and FR4)/150° C. (PET) for 2 minutes. On the laminated surface of metallic copper gel, solder paste was printed and reflowed under nitrogen. Good wetting properties of solder on metallic copper gel printed on polymeric substrate were seen. When 1026 components were soldered, the joint strength was 4-5 kg with a bulk failure.

The foregoing detailed description has been provided by way of explanation and illustration, and is not intended to limit the scope of the appended claims. Many variations in the presently preferred embodiments illustrated herein will be apparent to one of ordinary skill in the art and remain within the scope of the appended claims and their equivalents.

The present invention will now be described with reference to the following numbered clauses.

1. A sintering composition comprising:
   a solvent; and
   a metal complex dissolved in the solvent.
2. The sintering composition of clause 1, in the form of a gel, preferably a metallic gel.
3. The sintering composition of clause 1 or clause 2, wherein the sintering composition is for die attach.
4. The sintering composition of any one of the preceding clauses, wherein solvent is supersaturated with the metal complex.
5. The sintering composition of any one of the preceding clauses, wherein the sintering composition is substantially free of polymers, and preferably substantially free of organic polymers.
6. The sintering composition of any one of the preceding clauses, wherein the sintering composition is substantially free of metal particles and/or substantially free of particles of the metal complex.
7. The sintering composition of any one of the preceding clauses, wherein the metal complex comprises an organo-metal complex.
8. The sintering composition of clause 7, wherein the metal of the organo-metal complex is selected from one or more of Ag, Au, Pt, Pd, Ni, Cu, and Mo, preferably Cu and/or Ag.
9. The sintering composition of any one of the preceding clauses, wherein the metal complex comprises silver neodecanoate.
10. The sintering composition of any one of the preceding clauses, wherein the solvent has a boiling point of less than 300° C., preferably less than 250° C. and more preferably less than 200° C.
11. The sintering composition of any one of the preceding clauses, wherein the metal complex substantially decomposes at a temperature of less than 300° C., preferably less than 250° C. and more preferably less than 200° C.
12. The sintering composition of any one of the preceding clauses, wherein the sintering composition comprises the metal complex in an amount of 60 wt. % or more, preferably 70 wt. % or more, more preferably 75 wt. % or more, based on the total weight of the sintering composition.
13. The sintering composition of any one of the preceding clauses, wherein the sintering composition comprises 20 wt. % metal or more, preferably 25 wt. % metal or more, more preferably 30 wt. % metal or more, even more preferably 35 wt. % metal or more, based on the total weight of the sintering composition.
14. The sintering composition of any one of the preceding clauses, wherein the solvent comprises an organic solvent, preferably wherein the solvent is selected from one or more of propane-1-2-diol, terpineol, trigol or 2-methyl-1,3-propanediol, preferably terpineol.

15. The sintering composition of any one of the preceding clauses, wherein the viscosity of the sintering composition is between 70,000 and 80,000 cP 16. The sintering composition of any one of the preceding clauses, wherein the sintering composition is substantially free of metal oxide.

17. The sintering composition of any one of the preceding clauses, in the form of a free standing film or foil, and/or laminated on a wafer.

18. A sintering paste comprising:
a solvent, and
a metal complex suspended in the solvent.

19. The sintering paste of clause 18, comprising the sintering composition of any one clauses 1 to 17.

20. The sintering paste of clause 18 or clause 19, wherein the solvent comprises triethylene glycol.

21. The sintering paste of any one of clauses 18 to 20, wherein the metal complex is in an amount of 70 wt. % or more, preferably 80 wt. % or more, based on the total weight of the sintering paste.

22. The sintering paste of any one of clauses 18 to 21, wherein the sintering paste is for die attach.

23. The sintering paste of any one of clauses 18 to 22, in the form of a free standing film or foil, and/or laminated on a wafer.

24. A method of manufacturing the sintering composition of any of clauses 1-17, the method comprising:
at least partially dissolving a metal complex in a solvent to form a solution, and
milling the solution.

25. The method of clause 24, wherein the dissolving is carried out at a temperature of between 60° C. and 100° C., preferably between 70° C. and 80° C.

26. The method of clause 24 or 25, wherein the solution is cooled before milling.

27. A method of manufacturing the sintering paste of any one of clauses 18 to 23, the method comprising:
providing a slurry comprising a metal complex and a solvent, and
milling the slurry.

28. Use of the sintering composition of any one of clauses 1 to 17, and/or the sintering paste of any of clauses 18 to 23 in a method selected from: die attachment, wafer-to-wafer bonding, hermetic and near hermetic sealing, dispensing and the production of interconnect lines.

29. A method of forming a joint between two or more work pieces, the method comprising:
providing two or more work pieces to be joined,
providing the sintering composition of any one of clauses 1 to 17 and/or the sintering paste of any one of clauses 18 to 23 in the vicinity of the two or more work pieces, and
heating the sintering composition and/or sintering paste to at least partially evaporate the solvent.

30. The method of clause 29, wherein the solvent is substantially evaporated, preferably wherein the solvent is completely evaporated.

31. The method of clause 29 or clause 30, wherein the at least some of metal complex of the sintering composition and/or sintering paste decomposes, preferably wherein substantially all of the metal complex of the sintering composition and/or sintering paste decomposes.

32. The method of any one of clauses 29 to 31, wherein the heating is carried out at a temperature of less than 300° C., preferably less than 270° C., more preferably less than 250° C. and most preferably less than 230° C.

33. The method of any one of clauses 29 to 32, wherein the heating results in a joint substantially free of carbon.

34. The method of any one of clauses 29 to 33, wherein the metal of the metal complex is at least partially sintered.

35. A sintered joint formed using the sintering composition of any one of clauses 1 to 17 and/or the sintering paste of any one of clauses 18 to 23, preferably wherein the sintered joint is formed using the method of any one of clauses 29 to 34.

36. The sintered joint of clause 35, wherein the joint is substantially free of solvent, and preferably substantially free of carbon.

37. The sintered joint of clause 35 or 36, wherein the joint is substantially free of a metal complex.

The invention claimed is:

1. A sintering composition, consisting of:
a solvent; and
a metal complex dissolved in the solvent,
wherein:
the sintering composition contains at least 75 wt. % of the metal complex, based on the total weight of the sintering composition;
the sintering composition contains at least 20 wt. % of the metal of the metal complex, based on the total weight of the sintering composition; and
the solvent is supersaturated with the metal complex.

2. The sintering composition of claim 1 in the form of a gel.

3. The sintering composition of claim 1, wherein the metal complex substantially decomposes over a temperature range of less than 20° C.

4. The sintering composition of claim 1, wherein the sintering composition contains the metal complex in an amount of up to 95 wt. % based on the total weight of the sintering composition.

5. The sintering composition of claim 1, wherein the sintering composition contains at least 25 wt. % metal based on the total weight of the sintering composition.

6. The sintering composition of claim 1, wherein the metal complex substantially decomposes at a temperature of less than 200° C.

7. The sintering composition of claim 1, wherein the solvent and/or the ligand of the metal complex has a boiling point of less than 300° C.

8. The sintering composition of claim 1, wherein the metal of the metal complex is selected from one or more of silver, gold, platinum, palladium, nickel, copper and molybdenum.

9. The sintering composition of claim 1, wherein the solvent comprises an organic solvent selected from one or more of propane-1-2-diol, terpineol, triethylene glycol, glycerol and 2-methyl-1,3-propanediol.

10. The sintering composition of claim 1, wherein the metal complex is a metal carboxylate, wherein the carboxylate has the structure $RCOO^-$ wherein R is a branched or unbranched hydrocarbon chain having 14 carbon atoms or less.

11. The sintering composition of claim 1, wherein the metal complex is selected from one or more of silver neodecanoate, silver 2-ethyl hexanoate, silver oxalate, silver lactate, silver hexafluoroacetylacetonate cyclooctadiene, copper formate tetrahydrate and copper acetate.

12. The sintering composition of claim 1, wherein the viscosity of the sintering composition is from 60,000 to 120,000 cP.

13. The sintering composition of claim 1 in the form of a free-standing film or foil.

14. The sintering composition of claim 1, applied, deposited, printed or laminated on a wafer.

15. The sintering composition of claim 1, applied, deposited, printed or laminated on a substrate fabricated from glass and/or ceramic and/or a metal and/or a polymeric film and/or a composite material used as a printed circuit board.

16. The sintering composition of claim 1, wherein the solvent comprises an organic solvent selected from one or more of terpineol and glycerol.

17. The sintering composition of claim 1, wherein the metal complex is selected from one or more of silver neodecanoate and copper formate tetrahydrate.

18. A method of manufacturing the sintering composition of claim 1, the method comprising:

providing the solvent;

providing the metal complex; and dissolving the metal complex in the solvent at a temperature of from 60° C. to 180° C. to form the composition.

19. A sintering composition, consisting of:

a solvent selected from one or more of propane-1-2-diol, terpineol, triethylene glycol, glycerol and 2-methyl-1, 3-propanediol; and a metal complex dissolved in the solvent, wherein:

the sintering composition contains at least 70 wt. % of the metal complex, based on the total weight of the sintering composition;

the sintering composition contains at least 20 wt. % of the metal of the metal complex, based on the total weight of the sintering composition; and the solvent is supersaturated with the metal complex.

20. The sintering composition of claim 19, wherein the solvent is selected from one or more of propane-1-2-diol, triethylene glycol, glycerol and 2-methyl-1,3-propanediol.

21. A method of manufacturing the sintering composition of claim 19, the method comprising:

providing the solvent;

providing the metal complex; and dissolving the metal complex in the solvent at a temperature of from 60° C. to 180° C. to form the composition.

\* \* \* \* \*